United States Patent
Chao

[19]

[11] Patent Number: 6,153,464
[45] Date of Patent: Nov. 28, 2000

[54] METHOD OF FABRICATING A SEMICONDUCTOR MEMORY DEVICE HAVING A BRANCHING CAPACITOR

[75] Inventor: Fang-Ching Chao, Hsinchu, Taiwan

[73] Assignee: United Microelectronics Corp., Taiwan

[21] Appl. No.: 09/055,400

[22] Filed: Apr. 6, 1998

Related U.S. Application Data

[62] Division of application No. 08/706,705, Sep. 6, 1996, Pat. No. 5,863,821.

[30] Foreign Application Priority Data

Aug. 16, 1996 [TW] Taiwan ................................. 85110004

[51] Int. Cl.$^7$ ............................................... H01L 21/8242
[52] U.S. Cl. ............................................................ 438/254
[58] Field of Search ................................... 438/253–256, 438/396–399

[56] References Cited

U.S. PATENT DOCUMENTS

| | | |
|---|---|---|
| 5,071,783 | 12/1991 | Taguchi et al. . |
| 5,077,688 | 12/1991 | Kumanoya et al. . |
| 5,089,869 | 2/1992 | Matsuo et al. . |

(List continued on next page.)

FOREIGN PATENT DOCUMENTS

| | | |
|---|---|---|
| 0 516 031 A1 | 12/1992 | European Pat. Off. . |
| 4-26156 | 1/1992 | Japan . |
| 5-21745 | 1/1993 | Japan . |
| 5-251657 | 9/1993 | Japan . |
| 2 252 447 | 8/1992 | United Kingdom . |
| 5,102,820 | 4/1992 | Chiba . |
| 5,126,810 | 6/1992 | Gotou . |
| 5,142,639 | 8/1992 | Kohyama et al. . |
| 5,155,657 | 10/1992 | Oehrlein et al. . |
| 5,158,905 | 10/1992 | Ahn . |
| 5,164,337 | 11/1992 | Ogawa et al. . |
| 5,172,201 | 12/1992 | Suizu . |
| 5,196,365 | 3/1993 | Gotou . |
| 5,206,787 | 4/1993 | Fujioka . |

OTHER PUBLICATIONS

"Mini–Trenches in Polysilicon For DRAM Storage Capacitance Enhancement", IBM Technical Disclosure Bulletin, vol. 33, No. 9, Feb. 1991.

Ema et al., "3–Dimensional Stacked Capacitor Cell for 16M and 64M DRAMS", International Electron Devices Meeting, pp. 592–595, Dec. 1988.

Wakamiya et al., "Novel Stacked Capacitor Cell for 64–Mb DRAM", 1989 Symposium on VLSI Technology Digest of Technical papers, pp. 69–70.

*Primary Examiner*—Jey Tsai
*Attorney, Agent, or Firm*—Rabin & Champagne P.C.

[57] ABSTRACT

A method for fabricating a semiconductor memory device with a tree-type capacitor having increased area for reliable storage of electrical charges representative of data thereon. The tree-type capacitor includes a storage electrode having a trunk-like conductive layer coupled to at least one branch-like conductive layer, which can be structured in various shapes that allow the branch-Like conductive layer to have increased surface area. The branch-like conductive layers are formed by successively depositing at least one insulating layer and at least one conductive layer over the substrate such that the conductive layer makes a series of twists and turns, defining the shape of the branch-like conductive layer. The surface of the built-up wafer is removed until the conductive layer is divided into a number of segments. A contact hole is formed through the conductive layer to a drain/source region of a transistor in the device, and is filled with a conductive layer, forming the trunk-like layer. The insulating material is wet-etched away, leaving the conductive segment attached to the truck-like layer as a branch-like conductive layer. A dielectric layer is formed over exposed surfaces of the trunk-like conductive layer and the branch-like conductive layer, and a further conductive layer is formed overlaying the dielectric layer to serve as an opposing electrode of the tree-type capacitor.

17 Claims, 19 Drawing Sheets

U.S. PATENT DOCUMENTS

| | | |
|---|---|---|
| 5,266,512 | 11/1993 | Kirsch . |
| 5,274,258 | 12/1993 | Ahn . |
| 5,338,955 | 8/1994 | Tamura et al. . |
| 5,354,704 | 10/1994 | Yang et al. . |
| 5,371,701 | 12/1994 | Lee et al. . |
| 5,389,568 | 2/1995 | Yun . |
| 5,399,518 | 3/1995 | Sim et al. . |
| 5,438,011 | 8/1995 | Blalock et al. . |
| 5,443,993 | 8/1995 | Park et al. . |
| 5,453,633 | 9/1995 | Yun . |
| 5,460,996 | 10/1995 | Ryou . |
| 5,478,768 | 12/1995 | Iwasa . |
| 5,478,770 | 12/1995 | Kim . |
| 5,482,886 | 1/1996 | Park et al. . |
| 5,508,222 | 4/1996 | Sakao . |
| 5,521,419 | 5/1996 | Wakamiya et al. . |
| 5,523,542 | 6/1996 | Chen et al. . |
| 5,543,346 | 8/1996 | Keum et al. . |
| 5,550,080 | 8/1996 | Kim . |
| 5,561,309 | 10/1996 | Cho et al. . |
| 5,561,310 | 10/1996 | Woo et al. . |
| 5,572,053 | 11/1996 | Ema . |
| 5,595,931 | 1/1997 | Kim . |
| 5,863,821 | 1/1999 | Chao ........................................ 438/253 |

METHOD OF FABRICATING A SEMICONDUCTOR MEMORY DEVICE HAVING A BRANCHING CAPACITOR

This is a divisional of U.S. patent application Ser. No. 08/706,705, filed on Sep. 6, 1996, now U.S. Pat. No. 5,863,821, which issued on Jan. 26, 1999.

BACKGROUND OF THE INVENTION

1. Field of the Invention

This invention relates in general to semiconductor memory devices, and more particularly to a structure of a dynamic random access memory (DRAM) cell substantially composed of a transfer transistor and a charge storage capacitor.

2. Description of the Related Art

FIG. 1 is a circuit diagram of a memory cell for a DRAM device. As shown in the drawing, a DRAM cell is substantially composed of a transfer transistor T and a charge storage capacitor C. A source of the transfer transistor T is connected to a corresponding bit line BL, and a drain thereof is connected to a storage electrode 6 of the charge storage capacitor C. A gate of the transfer transistor T is connected to a corresponding word line WL. An opposing electrode 8 of the capacitor C is connected to a constant power source. A dielectric film 7 is provided between the storage electrode 6 and the opposing electrode 8.

In the DRAM manufacturing process, a two-dimensional capacitor called a planar type capacitor is mainly used for a conventional DRAM having a storage capacity less than 1M (mega=million) bits. In the case of a DRAM having a memory cell using a planar type capacitor, electric charges are stored on the main surface of a semiconductor substrate, so that the main surface is required to have a large area. This type of a memory cell is therefore not suited to a DRAM having a high degree of integration. For a high integration DRAM such as a DRAM with more than 4M bits of memory, a three-dimensional capacitor, called a stacked-type or a trench-type capacitor, has been introduced.

With the stacked-type or trench-type capacitors, it has been made possible to obtain a larger memory in a similar volume. However, to realize a semiconductor device of an even higher degree of integration, such as a very-large-scale integration (VLSI) circuit having a capacity of 64M bits, a capacitor of such a simple three-dimensional structure as the conventional stacked-type or trench-type, turns out to be insufficient.

One solution for improving the capacitance of a capacitor is to use the so-called fin-type stacked capacitor, which is proposed in Ema et al., "3-Dimensional tacked Capacitor Cell for 16M and 64M DRAMs", International Electron Devices Meeting, pp. 592–595, Dec. 1988. The fin-type stacked capacitor includes electrodes and dielectric films which extend in a fin shape in a plurality of stacked layers. DRAMs having the fin-type stacked capacitor are also disclosed in U.S. Pat. Nos. 5,071,783 (Taguchi et al.), 5,126,810 (Gotou); 5,196,365 (Gotou); and 5,206,787 (Fujioka).

Another solution for improving the capacitance of a capacitor is to use the so-called cylindrical-type stacked capacitor, which is proposed in Wakamiya et al., "Novel Stacked Capacitor Cell for 64-Mb DRAM", 1989 Symposium on VLSI Technology Digest of Technical Papers, pp. 69–70. The cylindrical-type stacked capacitor includes electrodes and dielectric films which extend in a cylindrical shape to increase the surface areas of the electrodes. A DRAM having the cylindrical-type stacked capacitor also is disclosed in the U.S. Pat. No. 5,077,688 (Kumanoya et al.).

With the trend toward increased integration density, the size of the DRAM cell in a plane (the area it occupies in a plane) must be further reduced. Generally, a reduction in the size of the cell leads to a reduction in charge storage capacity (capacitance). Additionally, as the capacitance is reduced, the likelihood of soft errors arising from the incidence of α-rays is increased. Therefore, there is still a need in this art to design a new structure of a storage capacitor which can achieve the same capacitance, while occupying a smaller area in a plane, and a suitable method of fabricating the structure.

SUMMARY OF THE INVENTION

It is therefore an object of the invention to provide a method for fabricating a semiconductor memory device which is structured with a tree-type capacitor that allows an increased area for charge storage.

In accordance with the foregoing and other objects of the invention, a new and improved method for fabricating a semiconductor memory device are provided.

The invention provides a method for fabricating a semiconductor memory device. The semiconductor memory device includes a substrate, a transfer transistor having source/drain regions, formed on the substrate, and a charge storage capacitor electrically coupled to one of the source/drain regions. According to the method, a first insulating layer is first formed over the substrate, such that it covers the transfer transistor. An insulating pillar is then formed over the first insulating layer, the insulating pillar defining recess areas on either side thereof. A first film of insulating material and a second film of conductive material are next alternately formed over the first insulating layer in a recess area and over the insulating pillar. A selected part of the second film that lies above the insulating pillar is then removed and a first conductive layer is formed which penetrates at least through the second film, the first film, and the first insulating layer so as to be electrically coupled to one of the source/drain regions The first conductive layer and the second film in combination thus form a storage electrode of the charge storage capacitor. The insulating pillar and the first film are then removed. A dielectric layer is formed over exposed surfaces of the first conductive layer and the second film, and a second conductive layer is formed over the dielectric layer. The second conductive layer thus functions as an opposing electrode of the charge storage capacitor.

A semiconductor memory device according to the invention is therefore formed having a tree-type capacitor of increased area for reliable storage thereon of electrical charges representative of data. By varying the number of conducting layers formed, interleaved with insulating layers, during fabrication, the total surface area of the capacitor electrodes can be controlled. The size, shape, and placement of the insulating pillar and the size, shape, and construction of the second conductive layer may also be varied to change the shape of the tree-type capacitor in order to satisfy particular design needs.

BRIEF DESCRIPTION OF DRAWINGS

Other objects, features, and advantages of the invention will become apparent from the following detailed description of the preferred but non-limiting embodiments. The description is made with reference to the accompanying drawings in which.

DETAILED DESCRIPTION OF THE PREFERRED EMBODIMENTS

First Preferred Embodiment

A description will be given of a first embodiment of a semiconductor memory device having a tree-type charge storage capacitor according to the invention, by referring to FIGS. 2A through 2G. This embodiment of the semiconductor memory device can be produced by a first preferred method for fabricating a semiconductor memory device according to the invention.

Figure 1:
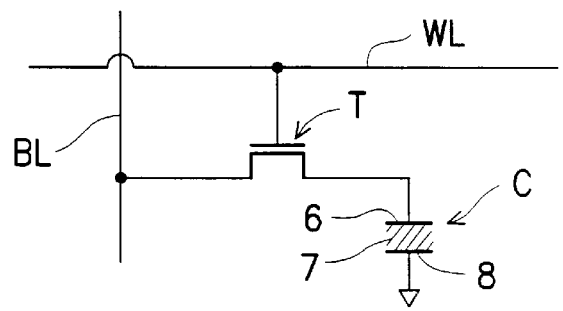
FIG. 1 is a circuit diagram of a memory cell of a DRAM device.
Figure 2A:
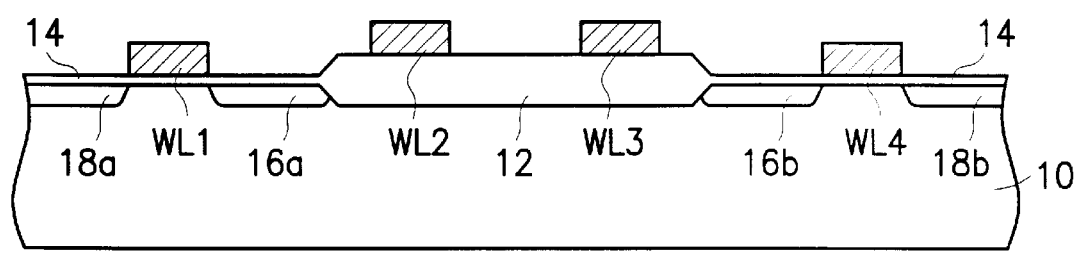
FIGS. 2A through 2G are cross-sectional views for explaining a first embodiment of a semiconductor memory cell having a tree-type capacitor according to the invention, and a method for fabricating the same according to the invention.

Referring to FIG. 2A, a surface of a silicon substrate 10 is subjected to thermal oxidation by the LOCOS (local oxidation of silicon) technique, and thereby a field oxidation film 12 having a thickness of approximately 3000 Å (angstroms), for example, is formed. Next, a gate oxidation film 14 having a thickness of approximately 150 Å, for example, is formed by subjecting the silicon substrate 10 to the thermal oxidation process. Then a polysilicon film having a thickness of approximately 2000 Å, for example, is deposited on the entire surface of the silicon substrate 10 by CVD (chemical vapor deposition) or LPCVD (low pressure CVD). In order to obtain a polysilicon film of low resistance, suitable impurities such as phosphorus ions, for example, are diffused into the polysilicon film. Preferably, a refractory metal layer is deposited over the polysilicon film, and then an annealing process is carried out to form polycide, so that the film's resistance is further decreased. The refractory metal may be tungsten (W), and its thickness is, for example, approximately 2000 Å. Thereafter, the polycide is subjected to a patterning process to form gate electrodes (or word lines) WL1 through WL4, as shown in FIG. 2A. Then, arsenic ions, for example, are diffused into the silicon substrate 10 at an energy of 70 KeV to provide an impurity concentration of approximately $1 \times 10^{15}$ atoms/cm$^2$, for example. In this step, the word lines WL1 through WL4 are used as mask films. Thereby, drain regions 16a and 16b and source regions 18a and 18b are formed in the silicon substrate 10.

Figure 2B:
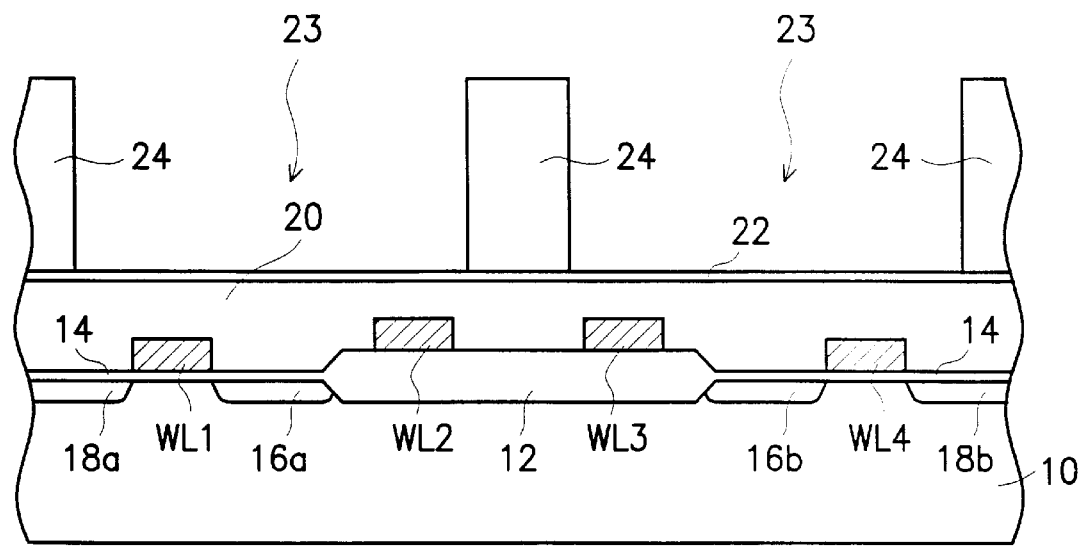

Referring next to FIG. 2B, in the subsequent step the CVD method is used to deposit a planarization insulating layer 20 of, for example, borophosphosilicate glass (BPSG), to a thickness of approximately 7,000 Å, for example. Then the same method is used to form an etching protection layer 22, which can be, for example, a silicon nitride layer, having a thickness of approximately 1,000 Å, for example. After that, a thick insulating layer of, for example silicon dioxide, is deposited over the wafer to a thickness of approximately 7,000 Å, for example. Conventional photolithographic and etching processes are then used to define an insulating pillar 24 bounded by recesses 23. Although FIG. 2B shows the insulating pillar 24 in a number of separate locations, the insulating pillar 24 is actually an integrated body, which is apparent when viewed from above.

Figure 2C:
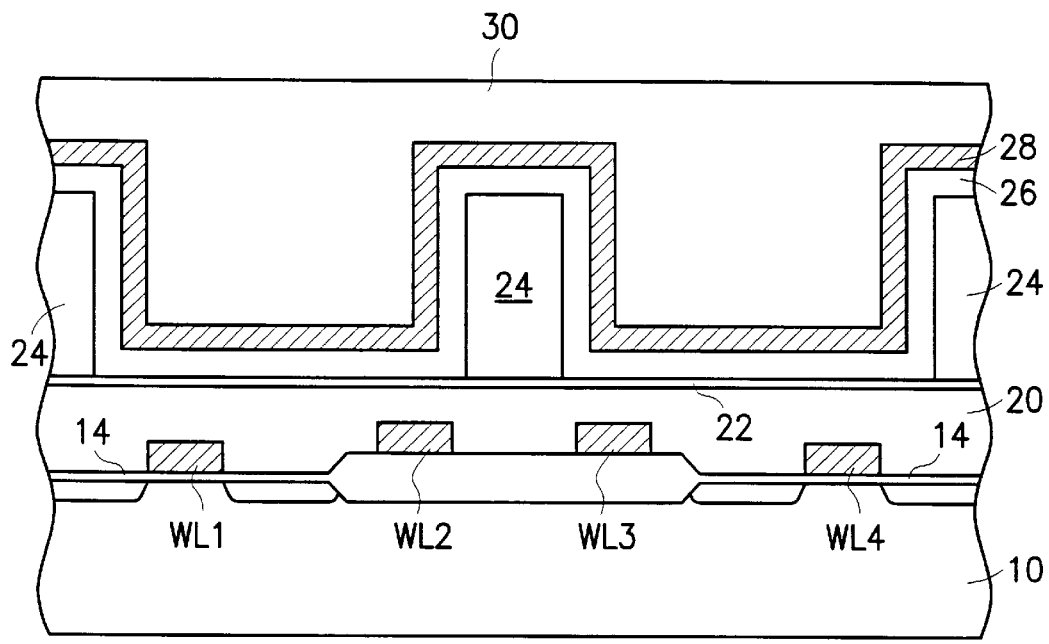

Referring next to FIG. 2C, in the subsequent step the CVD method is used successively to form a first insulating layer 26, a polysilicon layer 28, and a second insulating layer 30. The first and second insulating layers 26, 30 are preferably formed of silicon oxide. The first insulating layer 26 and the polysilicon layer 28 are each deposited to a thickness of approximately 1,000 Å, for example, and the second insulating layer 30 is deposited to a thickness of approximately 7,000 Å, for example. Arsenic (As) ions can be diffused into the polysilicon layer 28 so as to increase its conductivity.

Figure 2D:
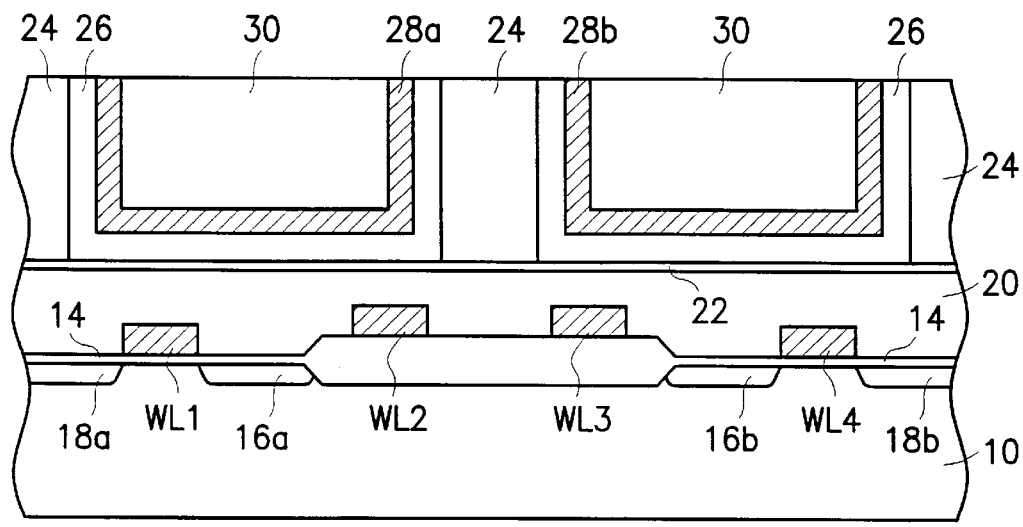

Referring next to FIG. 2D, in the subsequent step, chemical mechanical polishing (CMP) is performed on the surface of the wafer of FIG. 2C until an upper part of the polysilicon layer 28 is polished away. The remaining part of the polysilicon layer 28 includes a number of separate sections as designated by the numerals 28a, 28b shown in FIG. 2D.

Figure 2E:
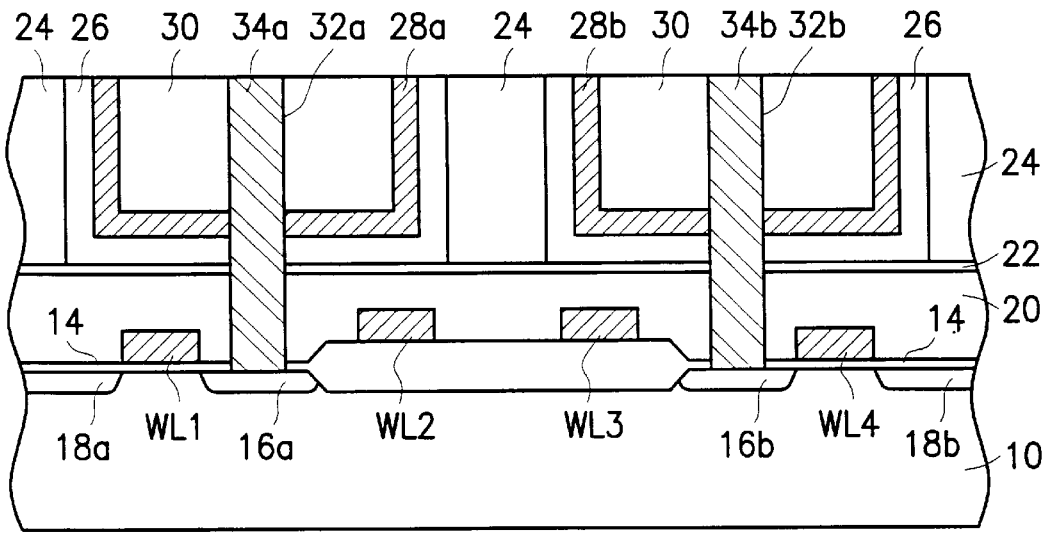

Referring next to FIG. 2E, conventional photolithographic and etching processes are then carried out to selectively etch, in sequence, the insulating layer 30, polysilicon layer sections 28a and 28b, insulating layer 26, etching protection layer 22, insulating layer 20, and gate oxidation film 14. As a result, storage electrode contact holes 32a and 32b are formed. The storage electrode contact holes 32a and 32b extend respectively from a top surface of the insulating layer 30 to a top surface of the drain regions 16a and 16b. A polysilicon film is then deposited and etched back to refill the storage electrode contact holes 32a and 32b with polysilicon layers 34a and 34b.

Figure 2F:
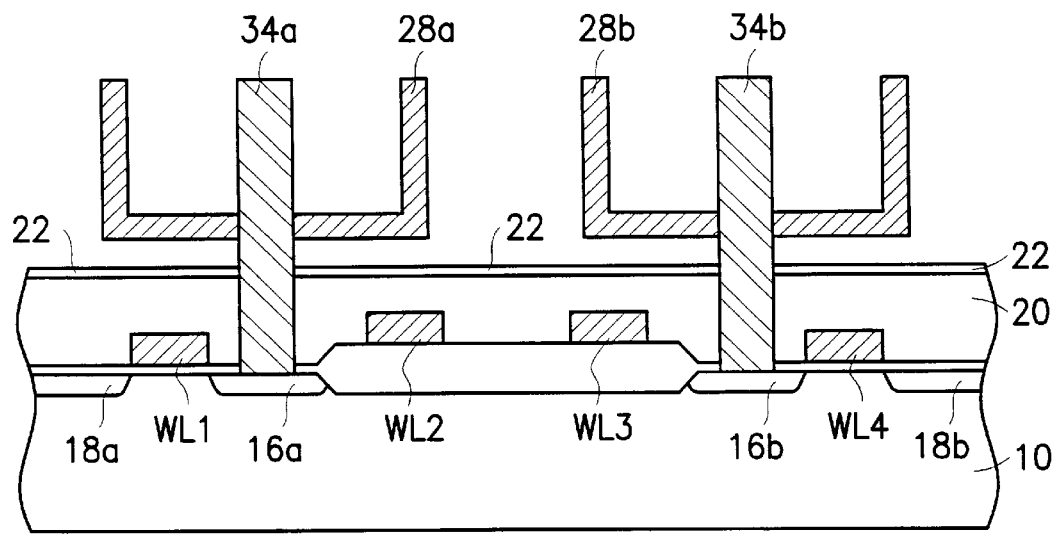

Referring next to FIG. 2F, in the subsequent step wet etching is performed on the wafer with the etching protection layer 22 as the etch end point, so as to remove the insulating layers 26, 30 and the insulating pillar 24. The remaining tree trunk-like polysilicon layers 34a, 34b and the branch-like polysilicon layers 28a, 28b, in combination form a tree-like storage electrode for the capacitor of the DRAM. The trunk-like polysilicon layers 34a, 34b are respectively electrically coupled to the drain regions 16a and 16b of the transfer transistors in the DRAM. The branch-like polysilicon layers 28a, 28b are each substantially L-shaped in cross section and have the substantially horizontal sections in electrical contact with the trunk-like polysilicon layers 34a, 34b. With this particular shape, the storage electrodes are hereinafter in this specification referred to as "tree-like storage electrodes", and the capacitors thus made are referred to as "tree-type capacitors".

Figure 2G:
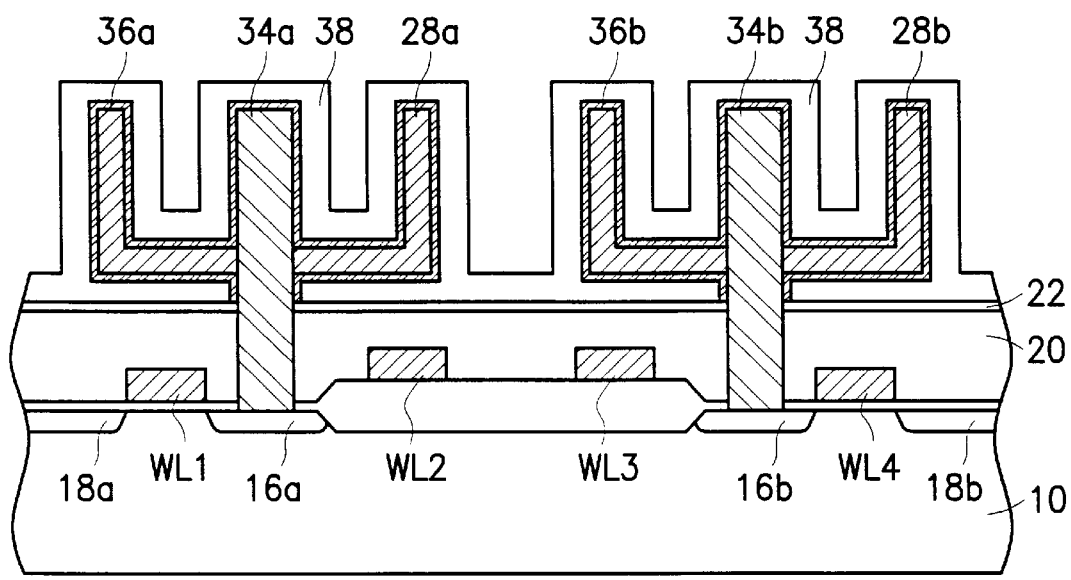

Referring next to FIG. 2G, in the subsequent step dielectric films 36a, 36b are respectively formed over the tree-like storage electrode (34a, 28a) and the tree-like storage electrode (34b, 28b). The dielectric films 36a, 36b can be formed of, for example, silicon dioxide, silicon nitride, NO (silicon nitride/silicon dioxide), ONO (silicon dioxide/silicon nitride/silicon dioxide), or the like. Next, an opposing electrode 38 of polysilicon, that opposes the storage electrodes (34a, 28a) and (34b and 28b), is formed over the dielectric films 36a, 36b. The process for forming the opposing electrode 38 includes a first step of depositing a polysilicon layer by the CVD method to a thickness of, for example, approximately 1,000 Å, a second step of diffusing N-type impurities into the polysilicon layer so as to increase the conductivity thereof, and a final step of using conventional photolithographic and etching processes to etch away selected parts of the polysilicon layer. The fabrication of the tree-type capacitors in the DRAM is then complete.

To complete the fabrication of the DRAM chip, the subsequent steps include fabricating bit lines, bonding pads, interconnections, passivations, and packaging. These steps involve only conventional techniques and are not within the spirit and scope of the invention, so that a detailed description thereof will not be provided herein.

Second Preferred Embodiment

In the foregoing first embodiment, the disclosed tree-type capacitor has only a single branch electrode. However, the number of branches is not limited to one and can be two or more. In the following, a second embodiment of the tree-type capacitor, which includes two branches of electrodes, is described with reference to FIGS. 3A through 3D. The tree-type capacitor of the second embodiment is based on the wafer structure of FIG. 2B. Elements in FIGS. 3A through 3D that are identical to those in FIG. 2B are labeled with the same numerals.

Figure 3A:
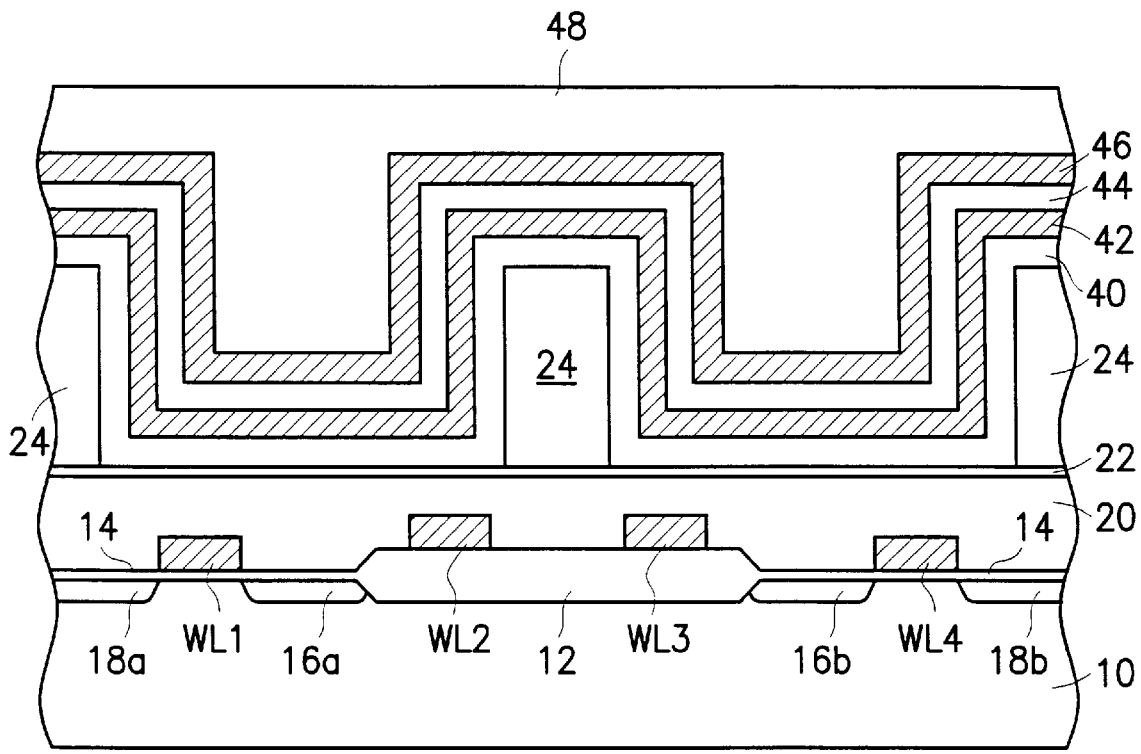
FIGS. 3A through 3D are cross-sectional views for explaining a second embodiment of a semiconductor memory cell having a tree-type capacitor according to the invention and a method for fabricating the same according to the invention.

Referring to FIG. 3A together with FIG. 2B, the CVD method is used to successively form alternate layers of insulation and polysilicon, including a first insulating layer 40, a first polysilicon layer 42, a second insulating layer 44, a second polysilicon layer 46, and a third insulating layer 48. The insulating layers 40, 44, 48 are formed preferably of, for example, silicon oxide. The insulating layers 40, 44 and the polysilicon layers 42, 46 are each deposited to a thickness of approximately 1,000 Å, for example, and the insulating layer 48 is deposited to a thickness of approximately 7,000 Å, for example. The polysilicon layers 42, 46 can be diffused with arsenic (As) ions so as to increase the conductivity thereof.

Figure 3B:
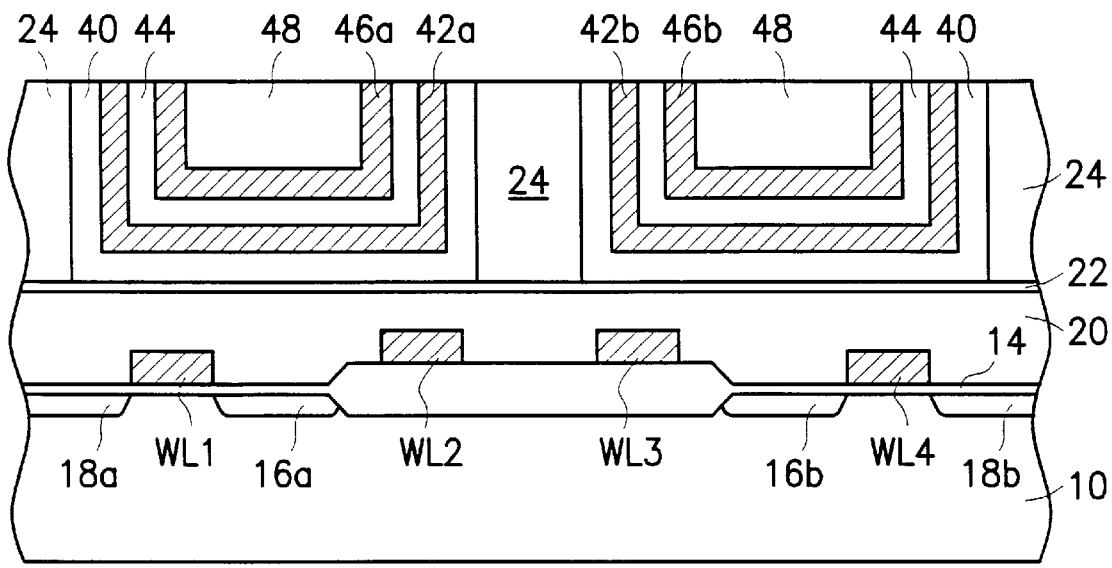

Referring next to FIG. 3B, in the subsequent step the CMP technique is applied to the surface of the wafer shown in FIG. 3A, so as to polish away an upper part of the polysilicon layers 42, 46. The remaining part of the polysilicon layers 42, 46 includes a number of separate sections designated by the numerals 42a, 46a, and 42b, 46b.

Figure 3C:
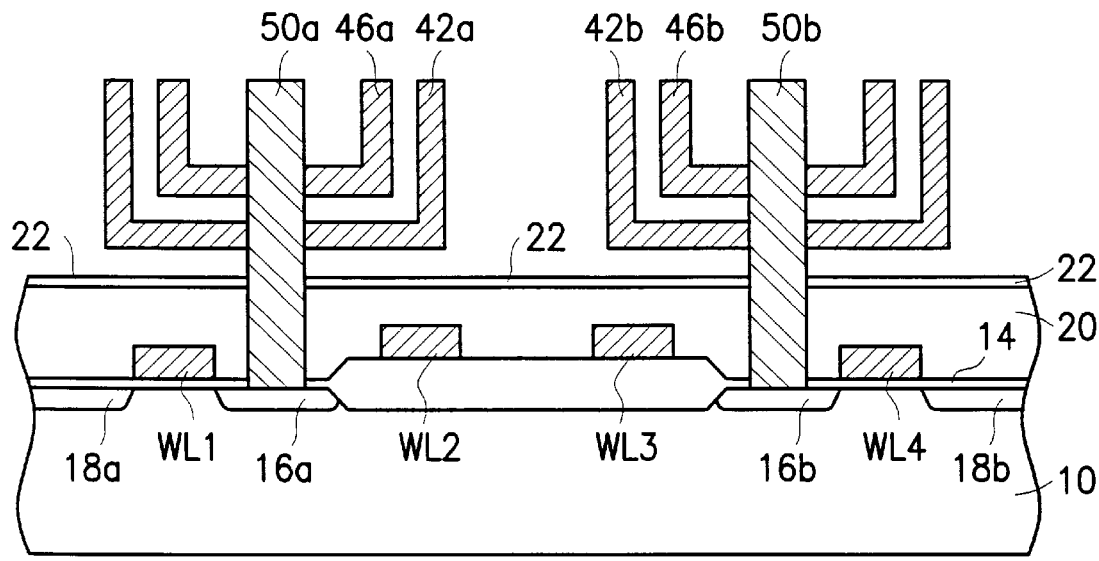

Referring next to FIG. 3C, in the subsequent step conventional photolithographic and etching processes are used to form storage electrode contact holes which extend from the top surface of the insulating layer 48 (see FIG. 3B) to the surface of the drain regions 16a and 16b. The storage electrode contact holes are then refilled with polysilicon layers 50a, 50b by first using the CVD method to deposit a polysilicon layer, and then etching back part of the polysilicon layer. Subsequently, wet etching is performed on the wafer, with the etching protection layer 22 as the etch end point, so as to remove the insulating layers 40, 44, 48 and the insulating pillar 24. The remaining trunk-like polysilicon layers 50a, 50b and the branch-like polysilicon layers 42a, 46b and 42b, 46b in combination form two tree-like storage electrodes. The trunk-Like polysilicon layers 50a, 50b are respectively electrically coupled to the drain regions 16a and 16b of the transfer transistors in the DRAM. The branch-like polysilicon layers 42a, 46a and 42b, 46b are each substantially L-shaped in cross section, and have substantially horizontal sections in contact with the trunk-like polysilicon layers 50a, 50b.

Figure 3D:
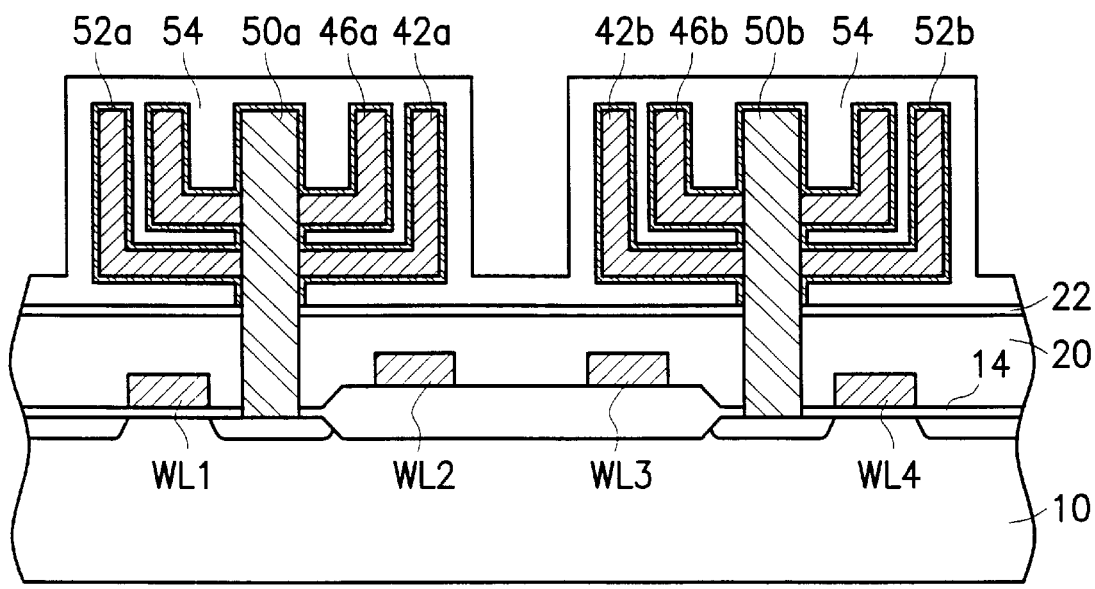

Referring next to FIG. 3D, in the subsequent step dielectric films 52a, 52b are respectively formed on the tree-like storage electrodes (50a, 46a, 42a) and (50b, 46b, 42b). Next, an opposing polysilicon electrode 54 is formed over the dielectric films 52a, 52b. The process for forming the opposing electrode 54 includes a first step of depositing a polysilicon layer by the CVD method, a second step of diffusing N-type impurities into the polysilicon layer so as to increase the conductivity thereof, and a final step of using conventional photolithographic and etching processes to etch away selected part of the polysilicon layer. After that, the fabrication for the tree-type capacitors in the DRAM is complete.

Third Preferred Embodiment

In the foregoing first and second embodiments, the bottom-most layer of the branch-like part of the tree-like storage electrode is separated from the etching protection layer 22. However, the invention is not limited to such a structure. In the following, a third embodiment of the invention in which the bottom-most layer of the branch-like part of each tree-like storage electrode is in contact with the etching protection layer 22 is described, with reference to FIGS. 4A and 4B.

The tree-type capacitors of the third embodiment are also based on the structure of FIG. 2B. Elements in FIGS. 4A through 4D that are identical to those in FIG. 2B are labeled with the same numerals.

Figure 4A:
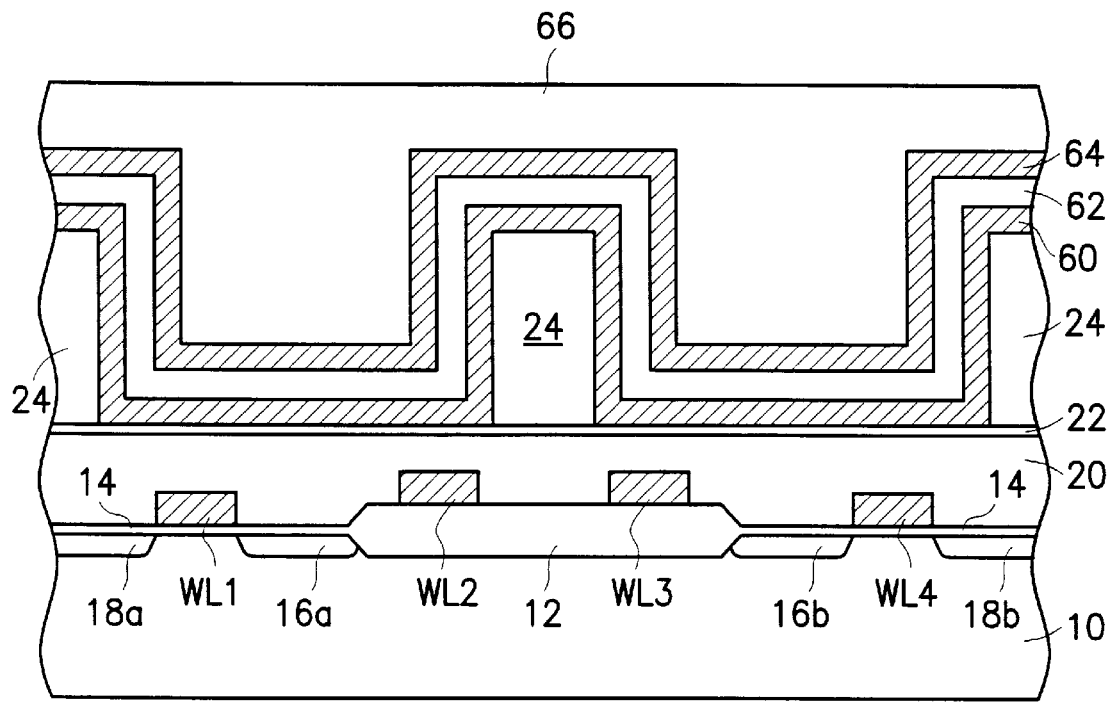
FIGS. 4A and 4B are cross-sectional views for explaining a third embodiment of a semiconductor memory cell having a tree-type capacitor according to the invention and a method for fabricating the same according to the invention.

Referring first to FIG. 4A together with FIG. 2B, the CVD method is used successively to form alternate layers of insulation and polysilicon including a first polysilicon layer 60, a first insulating layer 62, a second polysilicon layer 64, and a second insulating layer 66.

Figure 4B:
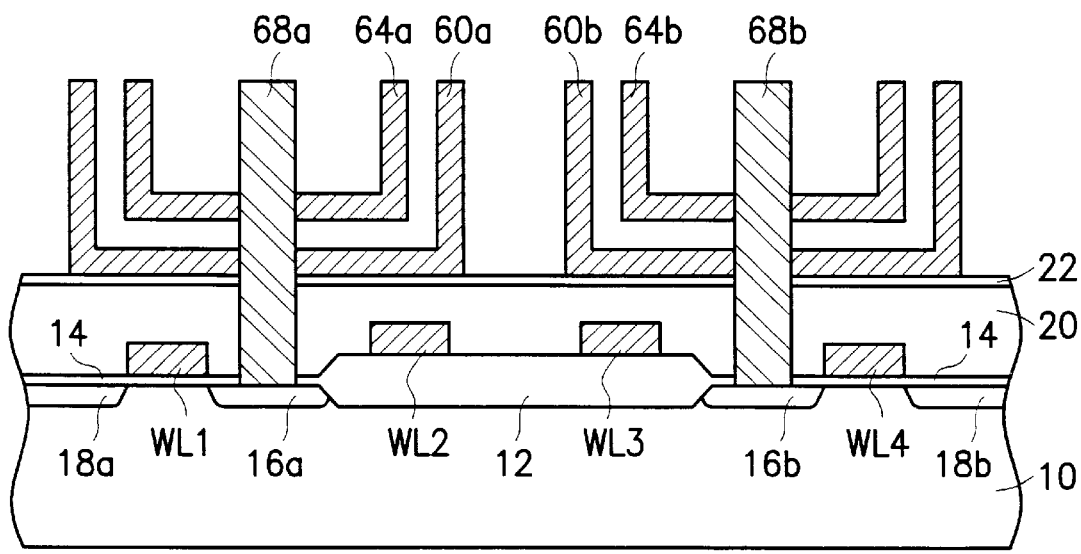

Referring next to FIG. 4B, in the subsequent step the CMP technique is applied to the surface of the wafer shown in FIG. 4A, so as to polish away an upper part of the polysilicon layers 60, 64. The remaining parts of the polysilicon layers 60, 64 include a number of separate sections designated by the numerals 60a, 64a, and 60b, 64b. Next, conventional photolithographic and etching processes are used to form storage electrode contact holes. The storage electrode contact holes are then refilled with polysilicon layers 68a, 68b. After that, wet etching is performed on the wafer, with the etching protection layer 22 as the etch end point, so as to remove the insulating layers 62, 66.

The remaining trunk-like polysilicon layers 68a, 68b and the branch-like polysilicon layers 60a, 64b and 60b, 64b in combination form two tree-like storage electrodes. The trunk-like polysilicon layers 68a, 68b are respectively electrically coupled to the drain regions 16a and 16b of the transfer transistor in the DRAM. The branch-like polysilicon layers 60a, 64a and 60b, 64b are each substantially L-shaped in cross section, and have substantially horizontal sections in contact with the trunk-like polysilicon layers 68a, 68b. In this embodiment, the branch-like polysilicon layers 60a, 60b of the tree-like storage electrodes are in contact with the etching protection layer 22. A dielectric film and opposing polysilicon electrode may now be formed as described previously for the first, second and third embodiments. After that, the fabrication for the tree-type capacitors in the DRAM is complete.

Fourth Preferred Embodiment

In the foregoing three embodiments, the trunk-like part of the tree-like storage electrode of each tree-type capacitor is an integrally formed semiconductor element. However, the invention is not limited to such a structure. In the following, a fourth embodiment, in which the trunk-like part of each tree-like storage electrode is composed of a plurality of semiconductor elements, is described, with reference to FIGS. 5A and 5D.

The tree-type capacitor of the fourth embodiment is also based on the structure of FIG. 2A. Elements in FIGS. 5A through 5D that are identical to those in FIG. 2A are labeled with the same numerals.

Figure 5A:
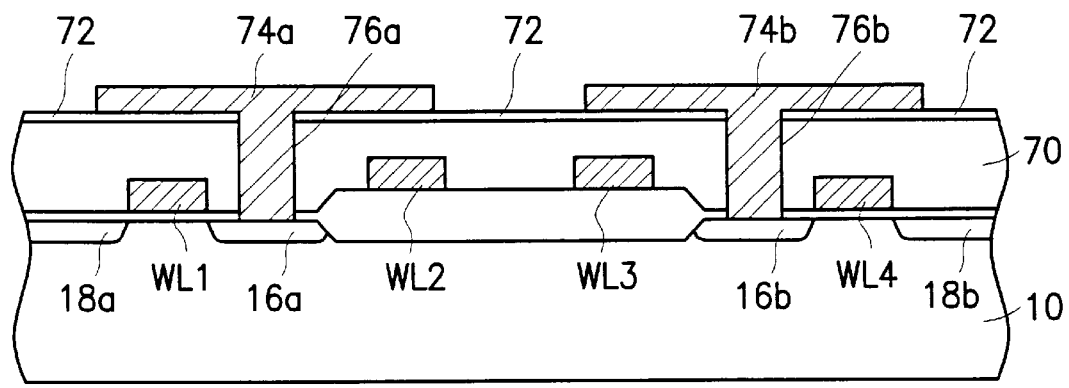
FIGS. 5A through 5D are cross-sectional views for explaining a fourth embodiment of a semiconductor memory cell having a tree-type capacitor according to the invention and a method for fabricating the same according to the invention.

Referring first to FIG. 5A together with FIG. 2A, the CVD method is used to deposit a planarization insulating layer 70 over the wafer of, for example, BPSG. Then the same method is used to deposit an etching protection layer 72 of, for example, silicon nitride. After that, conventional photolithographic and etching processes are used to etch selected parts of the etching protection layer 72 and the planarization insulating layer 70, so as to form storage electrode contact holes 76a, 76b which extend from the top surface of the etching protection layer 72 to the top surface of the drain regions 16a and 16b. Next, the CVD method is used to deposit over the wafer a polysilicon layer which fills the storage electrode contact holes 76a, 76b. The polysilicon layer can be diffused with impurities so as to increase the conductivity thereof Conventional photolithographic and etching processes then are used to define T-shaped elements 74a, 74b, to form respective bottom parts of capacitor charge storage electrodes for memory cells in the DRAM.

Figure 5B:
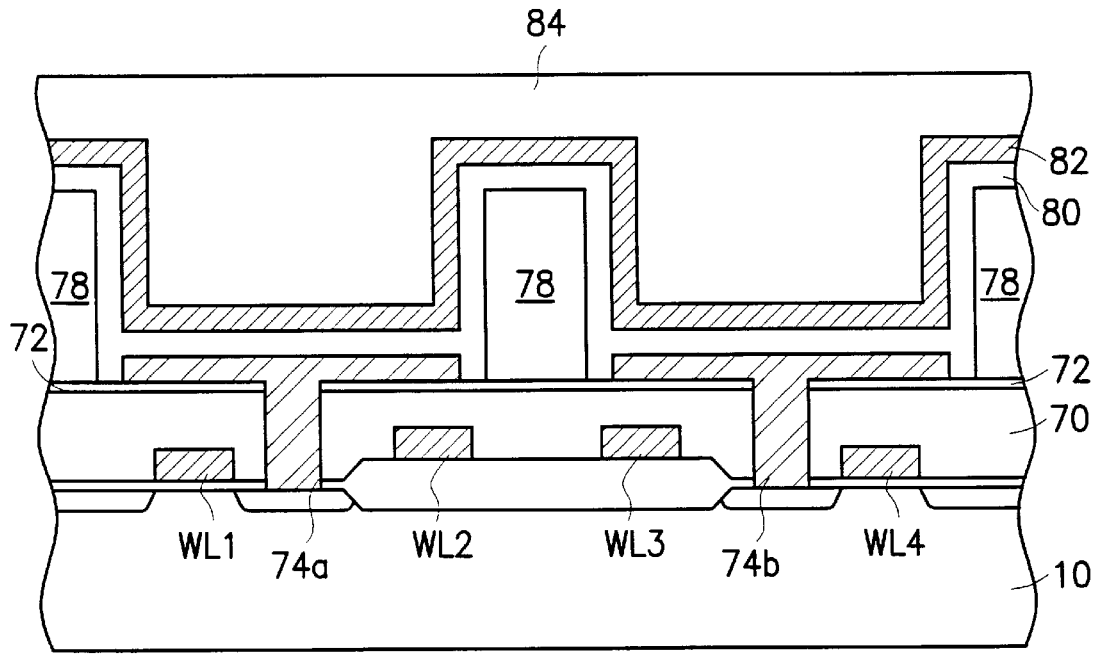

Referring next to FIG. 5B, in the subsequent step a thick insulating layer of, for example, silicon dioxide, is deposited over the wafer. Then, conventional photolithographic and etching processes are used to etch away selected parts of the insulating layer, so as to form insulating pillars 78. Next, the CVD method is used successively to form a first insulating layer 80, a polysilicon layer 82, and a second insulating layer 84.

Figure 5C:
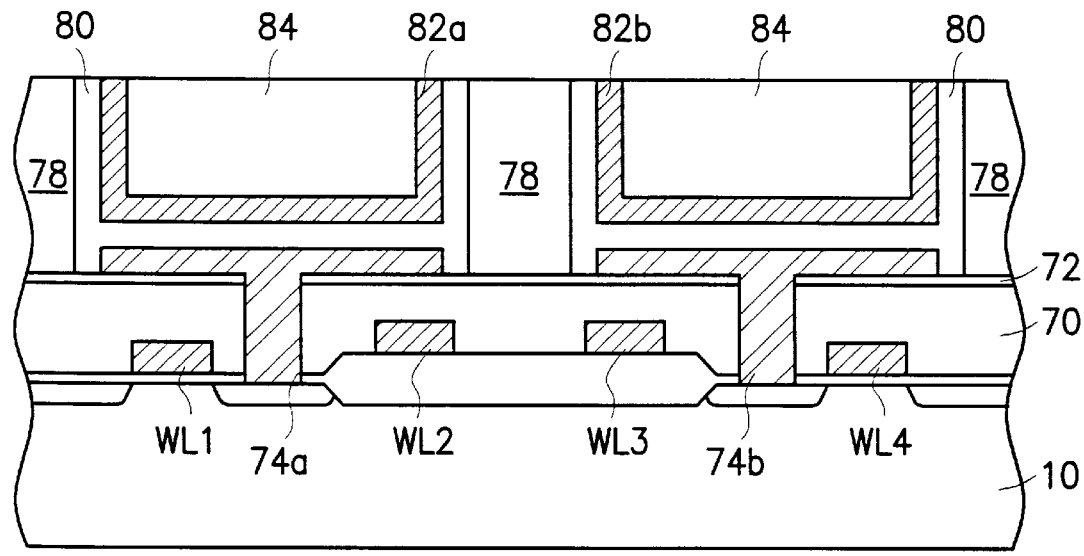

Referring next to FIG. 5C, in the subsequent step the CMP technique is applied to the surface of the wafer shown in FIG. 5B, so as to polish away an upper part of the polysilicon layer 82. The remaining part of the polysilicon layer 82 includes a number of separate sections designated by the numerals 82a, 82a.

Figure 5D:
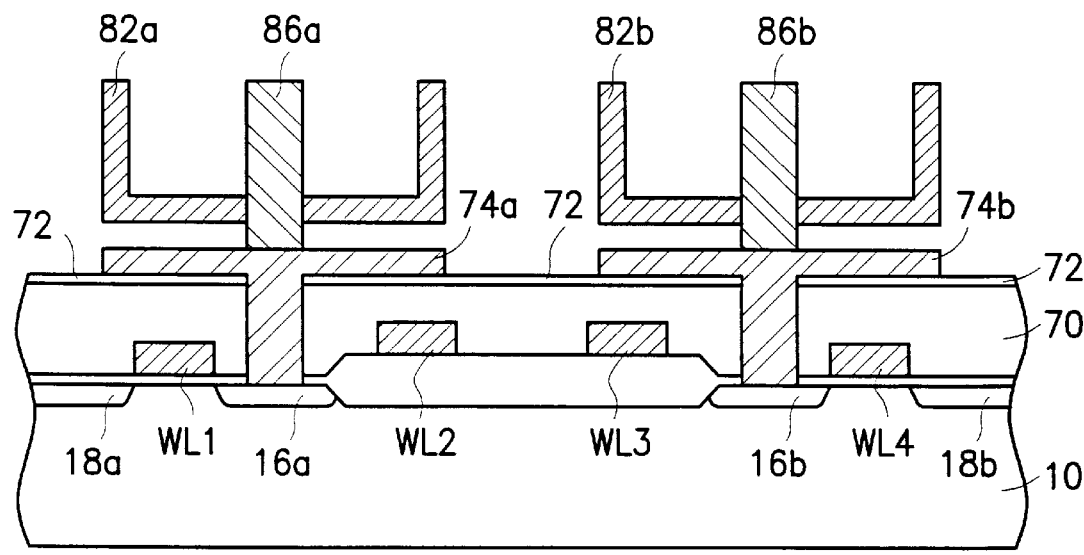

Referring next to FIG. 5D, in the subsequent step conventional photolithographic and etching processes are used to successively etch away selected parts of the second insulating layer 84, polysilicon layers 82a, 82b, and the first insulating layer 80, so as to form contact holes which extend from the top surface of the insulating layer 84 to the top surface of the T-shaped elements 74a, 74b of the tree-like storage electrodes. Then, the contact holes are refilled with polysilicon so as to form upper parts 86a, 86b of the tree-like storage electrodes. The process for refilling the polysilicon into the contact holes includes a first step of depositing a polysilicon layer by the CVD method, and a second step of etching back the same. After that, wet etching is performed on the wafer, with the etching protection layer 72 as the etch end point, so as to remove the insulating layers 84, 80 and the insulating pillar 78. This completes the fabrication of the storage electrodes of the tree-type capacitors in the DRAM. The embodiment differs from that of FIG. 2F in that the storage electrodes each include in addition a substantially horizontal section extended from the T-shaped elements, 74a, 74b on the bottom. A dielectric film and opposing polysilicon electrode may now be formed as described previously for the first, second and third embodiments. After that, the fabrication for the tree-type capacitors in the DRAM is complete.

Fifth Preferred Embodiment

In the foregoing four embodiments, the trunk-like part of the tree-like storage electrode is a solid semiconductor element. However, the invention is not limited to such a structure. The following description discloses a fifth embodiment with reference to FIGS. 6A and 6B, in which the trunk-like part of each tree-like storage electrode is hollow.

The tree-type capacitor of the fifth embodiment is based on the structure of FIG. 2D. Elements in FIGS. 6A and 6B that are identical to those in FIG. 2D are labeled with the same numerals.

Figure 6A:
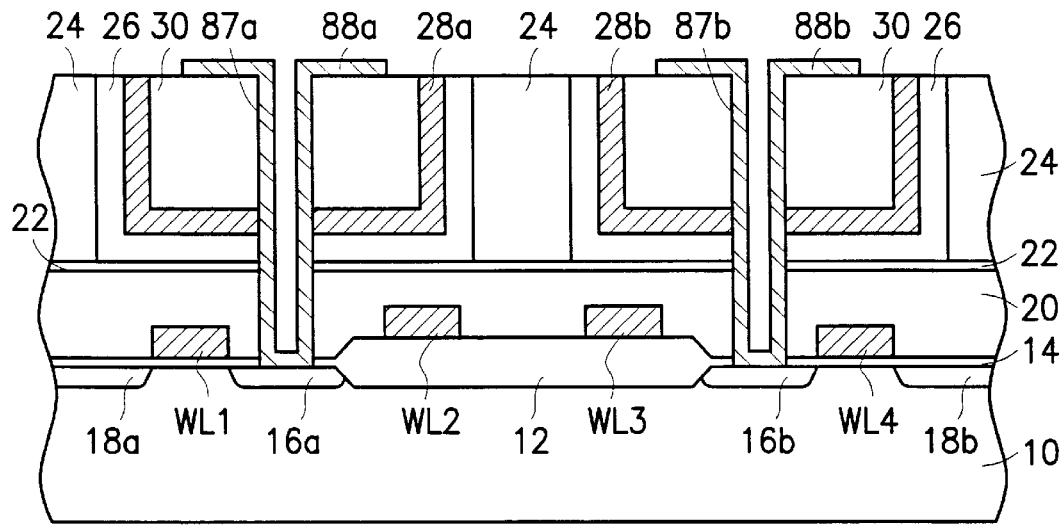
FIGS. 6A and 6B are cross-sectional views for explaining a fifth embodiment of a semiconductor memory cell having a tree-type capacitor according to the invention and a method for fabricating the same according to the invention.

Referring first to FIG. 6A together with FIG. 2D, after the fabrication has reached the stage shown in FIG. 2D, conventional photolithographic and etching processes are used to etch away selected parts of the insulating layer 30, the branch-like polysilicon layer 28a, 28b, the insulating layer 26, the etching protection layer 22, the planarization insulating layer 20, and the gate oxidation film 14, so as to form storage electrode contact holes 87a, 87b which extend from the top surface of the insulating layer 30 to the top surfaces of the drain regions 16a and 16b. Next, the CVD method is used to deposit a polysilicon layer in such a manner that the polysilicon layer is formed only on the inner walls of the storage electrode contact holes 87a, 87b, and do not fill up the holes. After that, conventional photolithographic and etching processes are used to define trunk-like polysilicon layers 88a, 88b for the respective storage electrodes of the memory cells in the DRAM. As illustrated in FIG. 6A, the trunk-like polysilicon layers 88a, 88b are each substantially U-shaped in cross section, which provides an increased area on which the storage electrodes can store large amounts of electric charge.

Figure 6B:
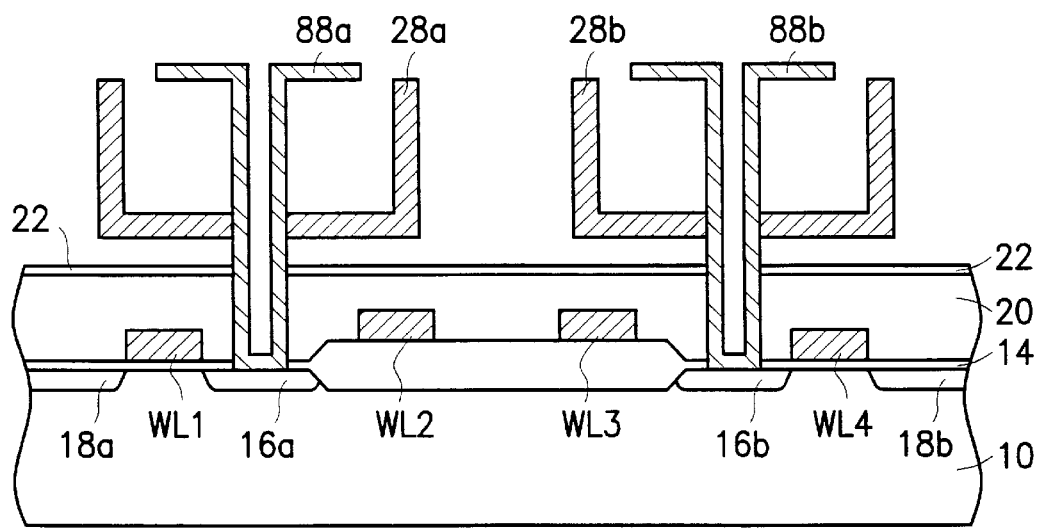

Referring next to FIG. 6B, in the subsequent step wet etching is performed on the wafer, with the etching protection layer 22 as the etch end point, so as to remove the insulating layers 30, 26 and the insulating pillar 24. This completes the fabrication of the storage electrodes of the tree-type capacitors in the DRAM. The embodiment differs from that of FIG. 2F in that the trunk-like parts of the storage electrodes, namely the trunk-like polysilicon layers 88a, 88b, are hollow and have U-shaped cross sections, which provide the storage electrodes with an increased surface area. A dielectric film and opposing polysilicon electrode may now be formed as described previously for the first, second and third embodiments. After that, the fabrication for the tree-type capacitors in the DRAM is complete.

Sixth Preferred Embodiment

Figure 7A:
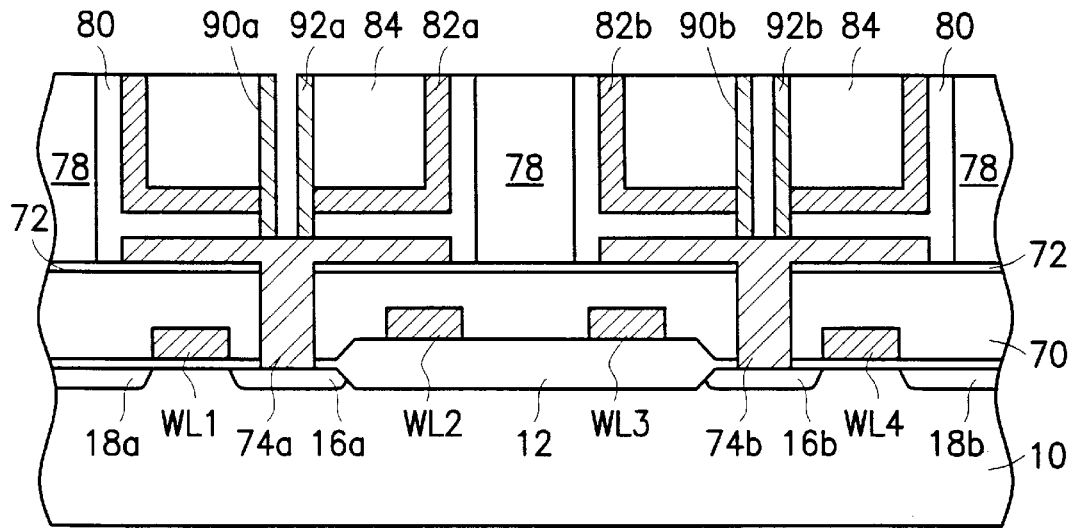
FIGS. 7A and 7B are cross-sectional views for explaining a sixth embodiment of a semiconductor memory cell having a tree-type capacitor according to the invention and a method for fabricating the same according to the invention.
Figure 7B:
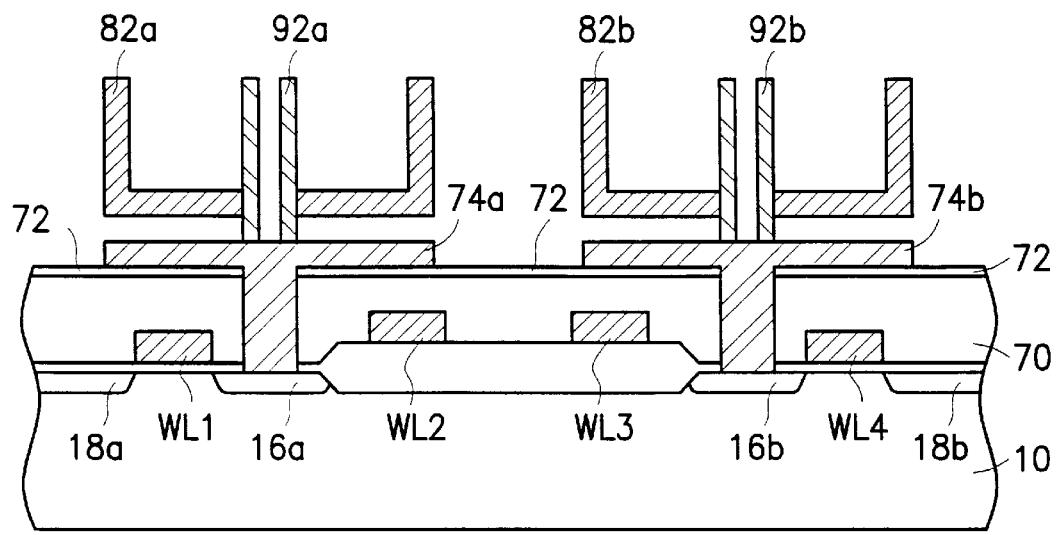

A sixth embodiment of the invention is illustrated in FIGS. 7A and 7B. In this embodiment also, the trunk-like part of each tree-like storage electrode is hollow. The tree-type capacitors of the sixth embodiment are based on the structure of FIG. 5C. Elements in FIGS. 7A and 7B that are identical to those in FIG. 5C are labeled with the same numerals.

Referring first to FIG. 7A together with FIG. 5C, after the fabrication has reached the stage shown in FIG. 5C, conventional photolithographic and etching processes are used to etch away selected parts of the insulating layer 84, the polysilicon layers 82a, 82b, and the insulating layer 80, so as to form contact holes 90a, 90b which extend downward from the top surface of the insulating layer 84 to the top surfaces of the T-shaped elements 74a, 74b of the storage electrodes. Next, the CVD method is used to deposit a polysilicon layer which is then etched back so as to form sidewall spacers 92a, 92b on the inner walls of the contact holes 90a, 90b. The sidewall spacers 92a, 92b constitute upper trunk-like parts of the tree-like storage electrodes, and are hollow with U-shaped cross sections, which provides the storage electrode with increased surface area.

Referring next to FIG. 7B, in the subsequent step wet etching is performed on the wafer, with the etching protection layer 72 as the etch end point, so as to remove the insulating layers 84, 80 and the insulating pillar 78. This completes the fabrication for the storage electrodes of the tree-type capacitors in the DRAM. The embodiment differs from that of FIG. 5D in that the upper part of each trunk-like electrode is hollow, and has a U-shaped cross section. A dielectric film and opposing polysilicon electrode may now be formed as described previously for the first, second and third embodiments. After that, the fabrication for the tree-type capacitors in the DRAM is complete.

Seventh Preferred Embodiment

In the foregoing six embodiments, the branch-like part of the tree-like storage electrode is L-shaped in cross section, so that it is crooked, with two straight segments. However, the invention is not limited to such a structure. The number of straight segments can be increased to three or more. The following description, with reference to FIGS. 8A and 8F, is of a seventh embodiment in which the branch-like part of each tree-like storage electrode is crooked, with four straight segments.

The tree-type capacitors of the seventh embodiment are based on the structure of FIG. 2A. Elements in FIGS. 8A through 8F that are identical to those in FIG. 2A are labeled with the same numerals.

Figure 8A:
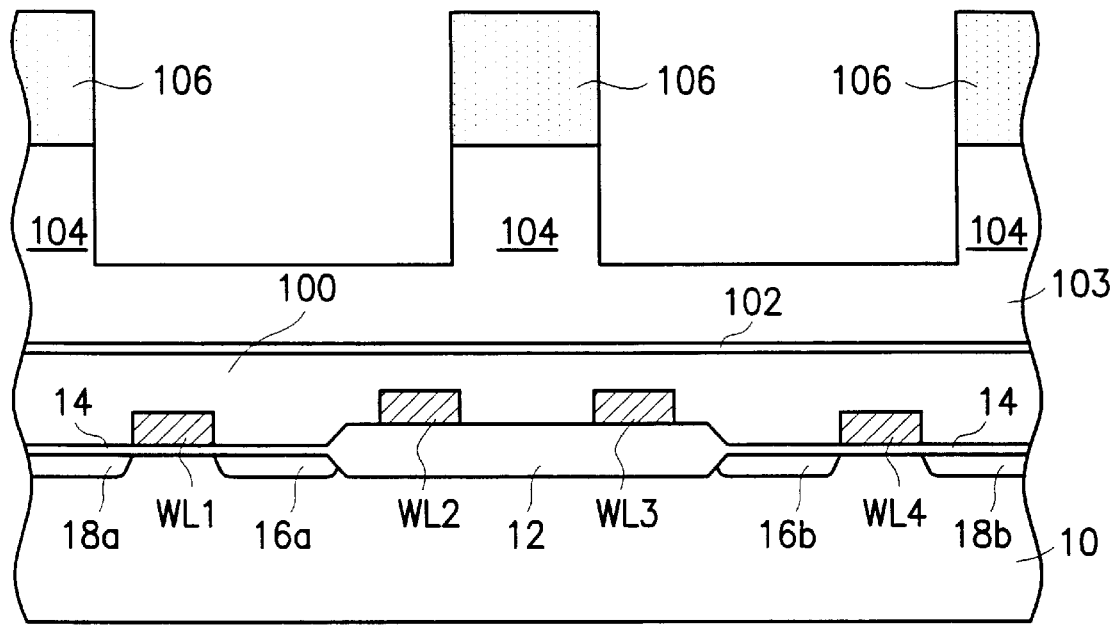
FIGS. 8A through 8F are cross-sectional views for explaining a seventh embodiment of a semiconductor memory cell having a tree-type capacitor according to the invention and a method for fabricating the same according to the invention.

Referring first to FIG. 8A together with FIG. 2A, after the fabrication has reached the stage shown FIG. 2A, the CVD method is used to deposit a planarization insulating layer 100 of, for example, BPSG. Then the same method is used to deposit an etching protection layer, which can be, for example, a silicon nitride layer 102. A thick insulating layer of, for example, silicon dioxide, is then deposited over the wafer. After that, a conventional photolithographic process is used to form a photoresist layer 106 and then anisotropic etching is performed on the exposed silicon dioxide layer, so as to form protruding insulating layers 104 and an underlying insulated layer 103.

Figure 8B:
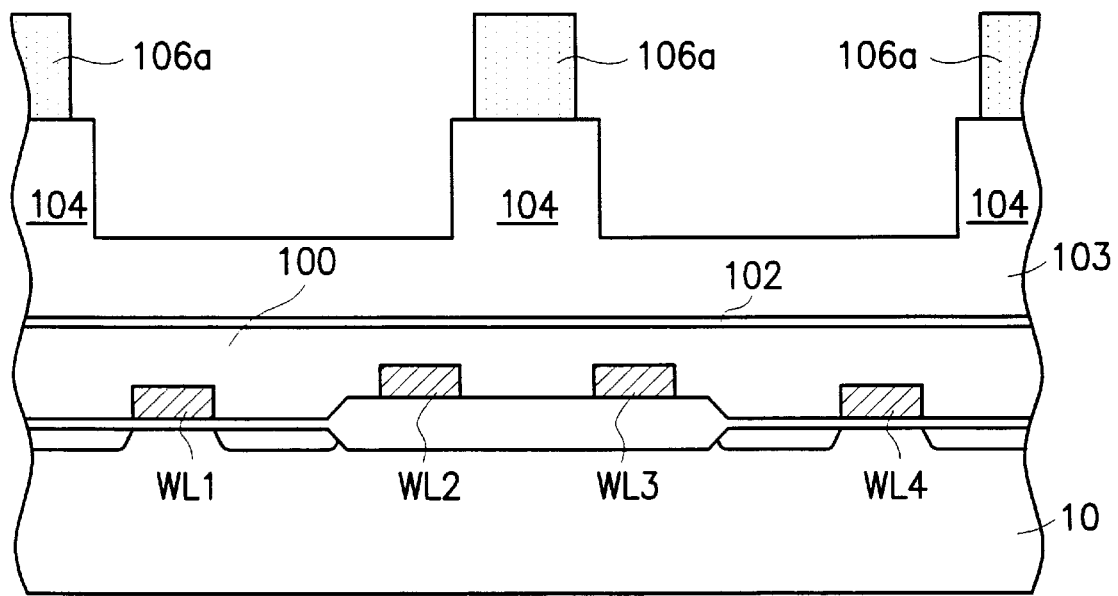

Referring next to FIG. 8B, in the subsequent step a photoresist erosion technique is performed to erode away part of the photoresist layer 106, so as to form a photoresist layer 106a that is reduced both in breadth and thickness (height). Part of the surface of the protruding insulating layers 104 formerly underlying the uneroded photoresist layer 106 is thereby exposed.

Figure 8C:
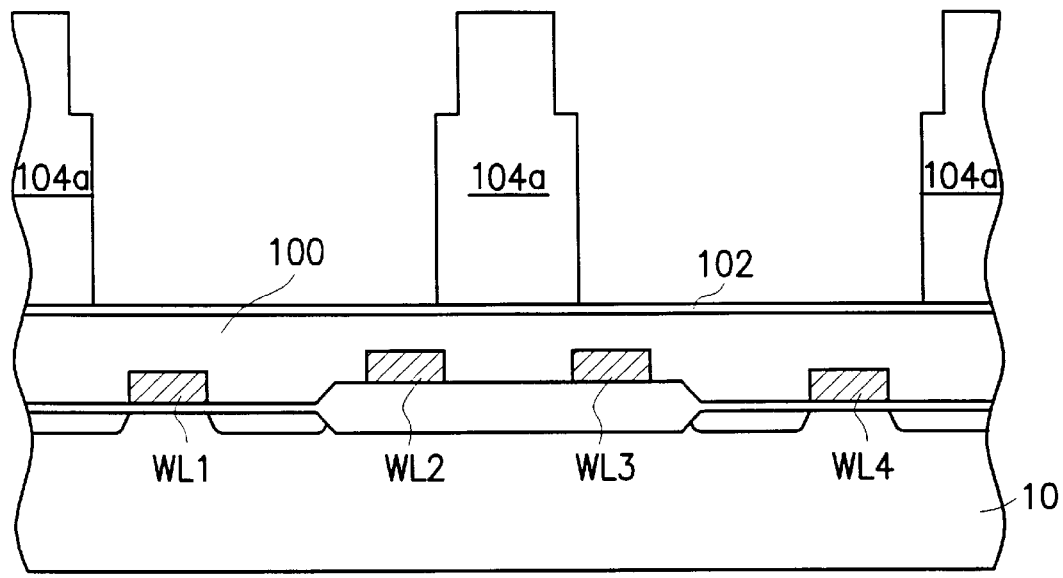

Referring next to FIG. 8C, in the subsequent step anisotropic etching is performed on the exposed surface of the protruding insulating layers 104 and the underlying insulating layer 103, until the silicon nitride layer 102, which serves as etching protection layer, is exposed. Protruding insulating layers 104a with stair-like sidewalls are thus formed. After that, the photoresist layer is removed.

Figure 8D:
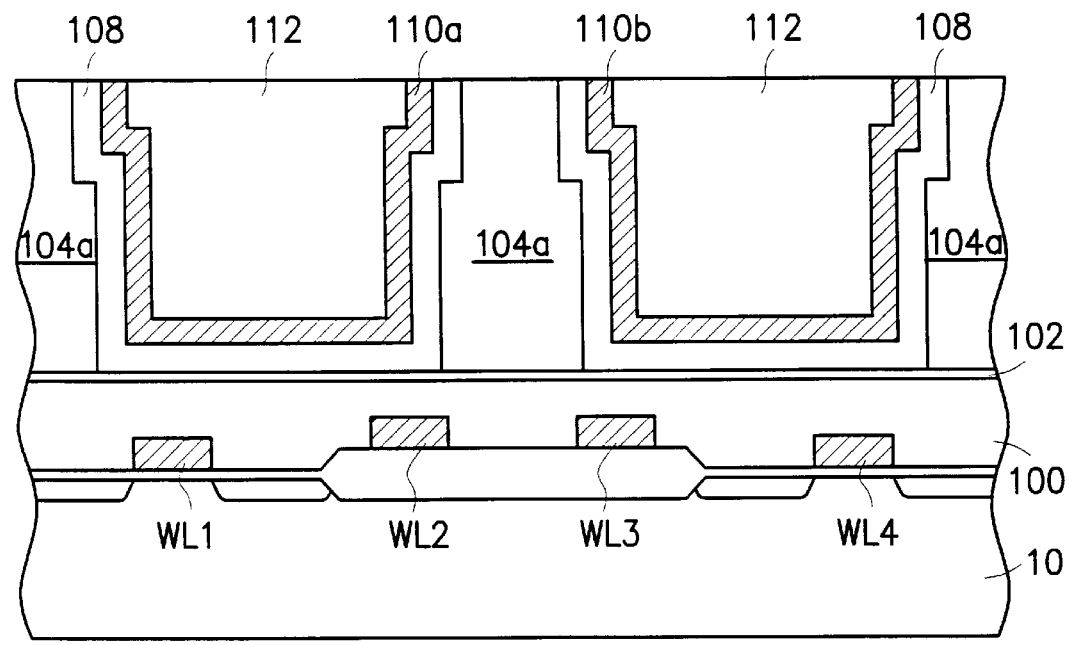

Referring next to FIG. 8D, the subsequent steps are the same as those shown in FIGS. 2C and 2D in which the CVD method is used successively to form a first insulating layer 108, a polysilicon layer, and a second insulating layer 112, and then the CMP technique is applied to the surface of the wafer so as to polish away an upper part of the polysilicon layer. The remaining part of the polysilicon layer thus includes a number of separate sections designated by the numerals 110a, 110b.

Figure 8E:
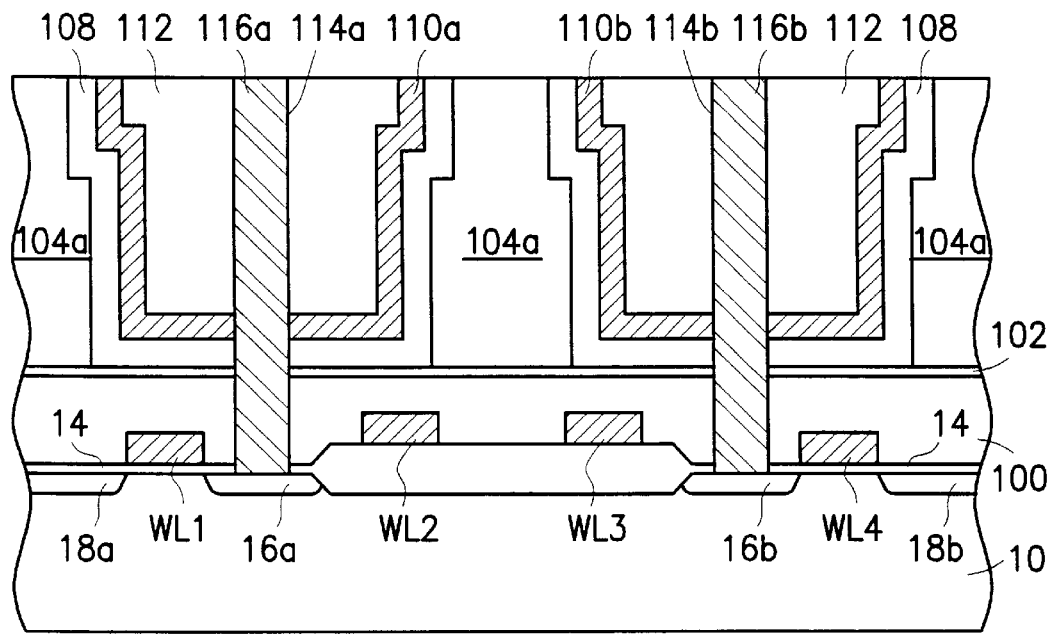
Figure 8F:
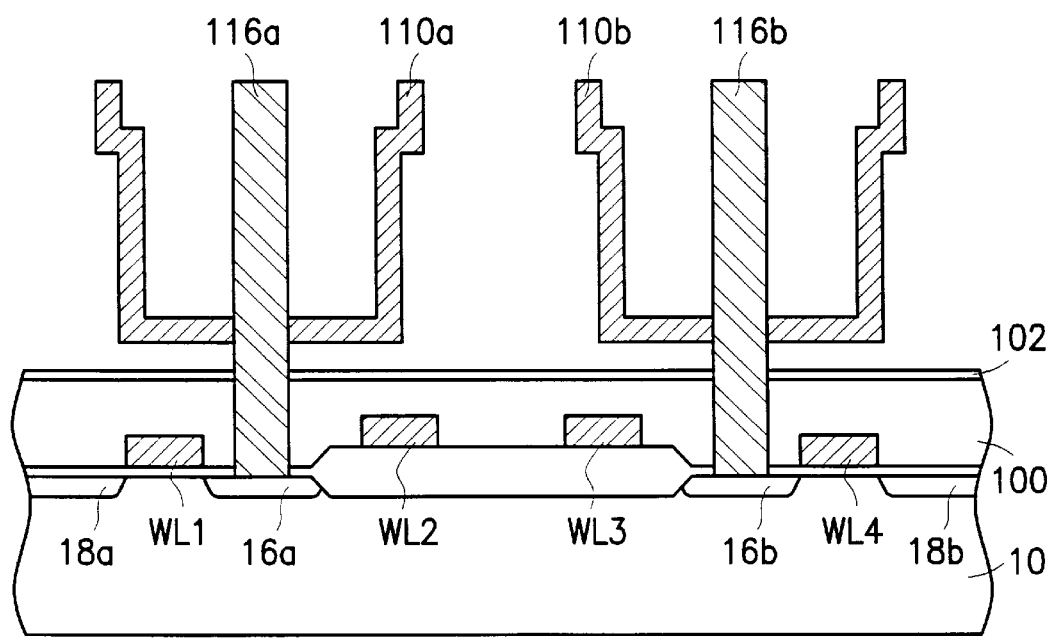

Referring next to FIG. 8E, in the subsequent step conventional photolithographic and etching processes are used to etch away successively selected parts of the insulating layer 112, the polysilicon layers 110a, 110b, the insulating layer 108, the silicon nitride layer 102, the planarization insulating layer 100, and the gate oxidation film 14, so as to form storage electrode contact holes 114a, 114b which extend from the top surface of the insulating layer 112 to the top surface of the drain regions 16a and 16b. After that, the storage electrode contact holes 114a, 114b are refilled with polysilicon layers 116a, 116b by first using the CVD method to deposit a polysilicon layer, and then etching back part of the polysilicon layer.

Referring next to FIG. 8F, in the subsequent step, wet etching is performed on the wafer, with the silicon nitride layer 102 as the etch end point, so as to remove the insulating layers 112, 108 of silicon dioxide and the insulating pillar 104a. This completes the fabrication of the storage electrodes of the tree-type capacitors in the DRAM. A dielectric film and opposing polysilicon electrode may now be formed as described previously for the first, second and third embodiments. After that, the fabrication for the tree-type capacitors in the DRAM is complete.

As illustrated in FIG. 8F, the storage electrodes of the tree-type capacitors include trunk-like polysilicon layers 116a, 116b and branch-like polysilicon layers 110a, 110b which are each crooked, with four straight segments. The trunk-like polysilicon layers 116a, 116b are electrically coupled to the drain regions 16a and 16b of the transfer transistor in the DRAM. The bottom-most, horizontal segments of the branch-like polysilicon layers 110a, 110b are in contact with the trunk-like polysilicon layers 116a, 116b.

The insulating pillars or protruding insulating layers of this embodiment are modified in shape so as to form the branch-like polysilicon layers with increased area for charge storage. However, the particular shapes of the insulating pillars and protruding insulating layers are not limited to those disclosed. Thus, referring to FIG. 2B, for example, isotropic etching or wet etching can be used instead of anisotropic etching to etch away part of the thick insulating layer. This permits the formation of near triangular-shaped insulating layers instead of the rectangular ones shown. In addition, also referring to FIG. 2B, after the insulating pillar 24 is formed, sidewall insulating layers can be formed on the sidewalls of the insulating pillar 24, so as to form insulating pillars of different shape. Therefore, the branch-like polysilicon layers can be modified into various shapes.

If it is desired to fabricate the branch-like polysilicon layers with an increased number of straight segments, the wafer structure of FIGS. 8B and 8C can be used as the base and subsequently, the photoresist erosion technique and anisotropic etching can be used repeatedly to form the protruding insulating layers with an increased number of step-like segments.

Eighth Preferred Embodiment

In the foregoing seven embodiments, the CMP technique is used to divide a single layer of polysilicon into separate sections used respectively to form individual storage electrodes. However, the invention is not limited to the use of the CMP technique for that purpose. Instead, according to an eighth embodiment of the invention illustrated in FIGS. 9A through 9D, conventional photolithographic and etching processes can be substituted for the CMP method, for dividing the single layer of polysilicon into the separate sections.

The tree-type capacitor of the eighth embodiment is based on the structure of FIG. 3A. Elements in FIGS. 9A through 9D that are identical to those in FIG. 3A are labeled with the same numerals.

Figure 9A:
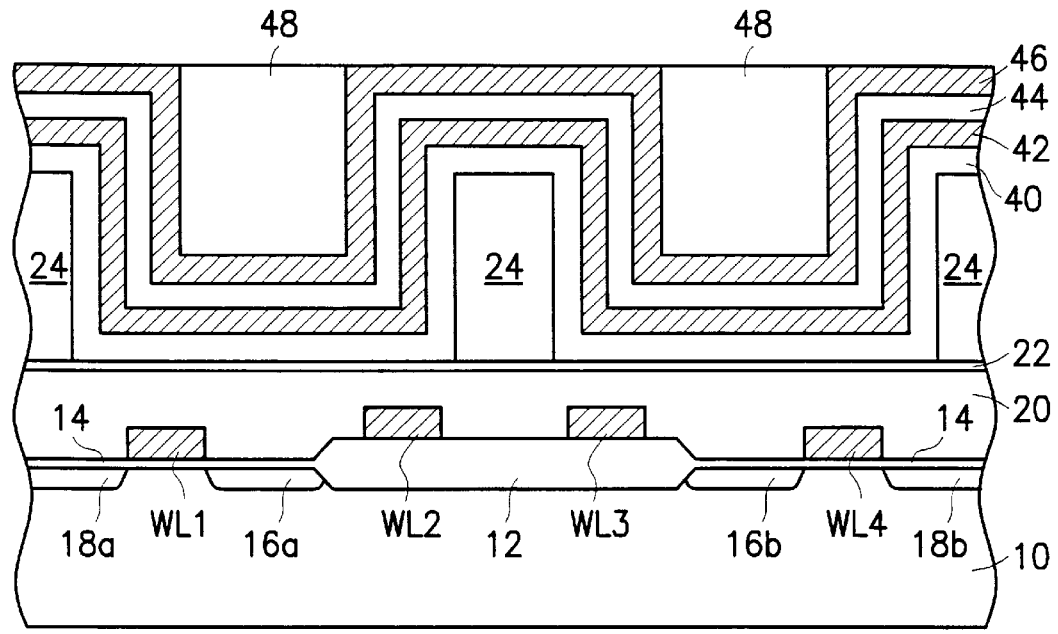
FIGS. 9A through 9D are cross-sectional views for explaining an eighth embodiment of a semiconductor memory cell having a tree-type capacitor according to the invention and a method for fabricating the same according to the invention.

Referring first to FIG. 9A together with FIG. 3A, after the fabrication has reached the stage shown in FIG. 3A, the topmost layer of silicon dioxide 48 is etched away or polished by the CMP technique, until the topmost polysilicon layer 46 is exposed. The resultant wafer structure is shown in FIG. 9A.

Figure 9B:
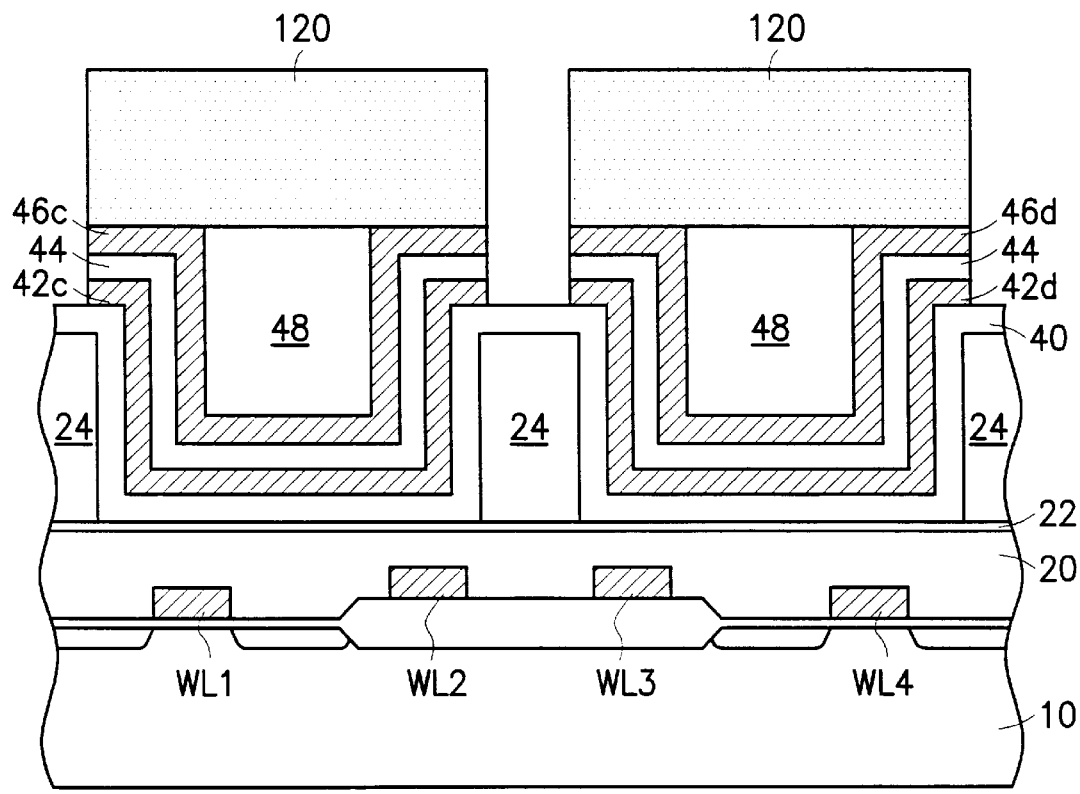

Referring next to FIG. 9B, a conventional photolithographic process is used to form a photoresist layer 120. After that, anisotropic etching is performed successively on the exposed parts of the polysilicon layer 46, the silicon dioxide layer 44, and the polysilicon layer 42. By such etching, the polysilicon layers 42, 46 are divided into a number of separate sections designated by the numerals 42c, 42d, and 46c, 46d.

Figure 9C:
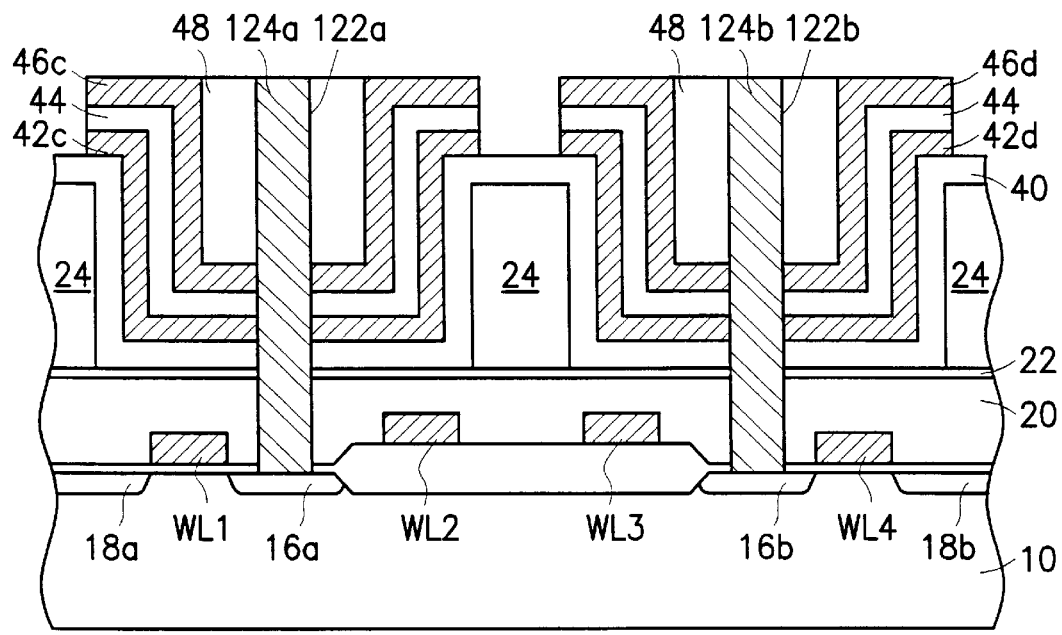

Referring next to FIG. 9C, conventional photolithographic and etching processes are then applied to form storage electrode contact holes 122a, 122b which extend from the top surface of the insulating layer 48 to the top surface of the drain regions 16a and 16b. Next, the storage electrode contact holes 122a, 122b are refilled with polysilicon layers 124a, 124b, by first using the CVD method to deposit a polysilicon layer and then etching back part of the polysilicon layer.

Figure 9D:
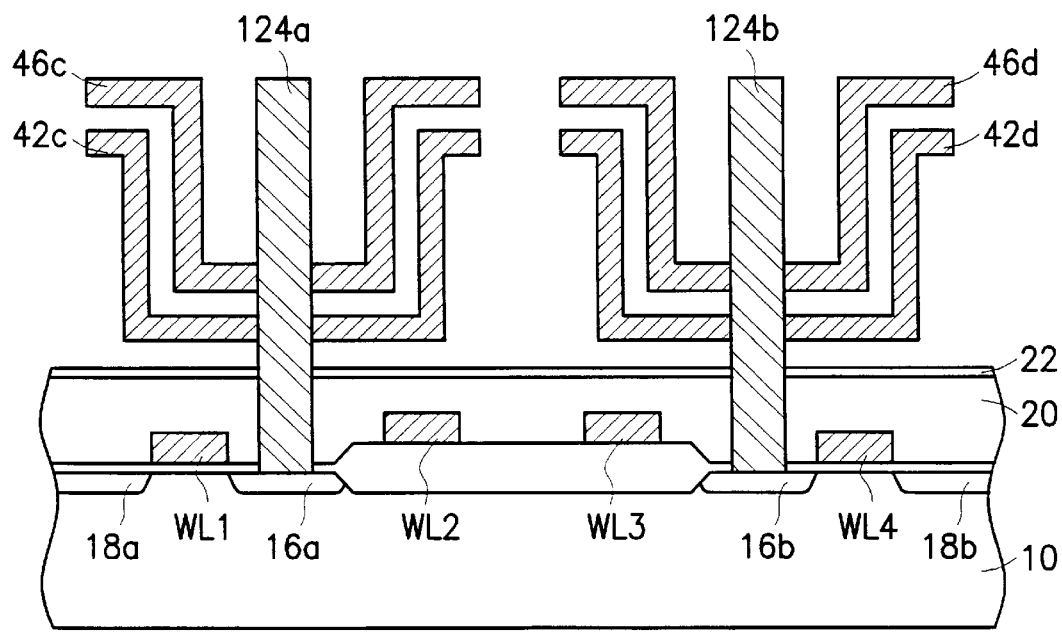

Referring next to FIG. 9D, in the subsequent step wet etching is performed on the wafer, with the etching protection layer 22 as the etch end point, so as to remove the insulating layers 40, 44, 48 of silicon dioxide and the insulating pillar 24. This completes the fabrication of the storage electrodes of the tree-type capacitors. A dielectric film and opposing polysilicon electrode may now be formed as described previously for the first, second and third embodiments. After that, the fabrication for the tree-type capacitors in the DRAM is complete.

These electrodes are composed of trunk-like polysilicon layers 124a, 124b and branch-like polysilicon layers 42c, 46c and 42d, 46d, each consisting of three straight segments. The trunk-like polysilicon layers 124a, 124b are electrically coupled respectively to the drain regions 16a and 16b of the transfer transistors in the DRAM. The branch-like polysilicon layers 42c, 46c and 42d, 46d have their respective bottom-most, horizontal segments in contact with the trunk-like polysilicon layers 50a, 50b.

Ninth Preferred Embodiment

In the foregoing first through seventh embodiments, the branch-like polysilicon layers have their topmost segments aligned substantially in the same horizontal plane; and in the eighth embodiment, the branch-like polysilicon layers have their topmost segments aligned substantially in the same vertical plane. However, the invention is not limited to such structures. Instead, according to a ninth embodiment of the invention illustrated in FIGS. 10A through 10D, the topmost segments of the branch-like polysilicon layers are not aligned.

The tree-type capacitor of the ninth embodiment is based on the structure of FIG. 9A. Elements in FIGS. 10A through 10D that are identical to those in FIG. 9A are labeled with the same numerals.

Figure 10A:
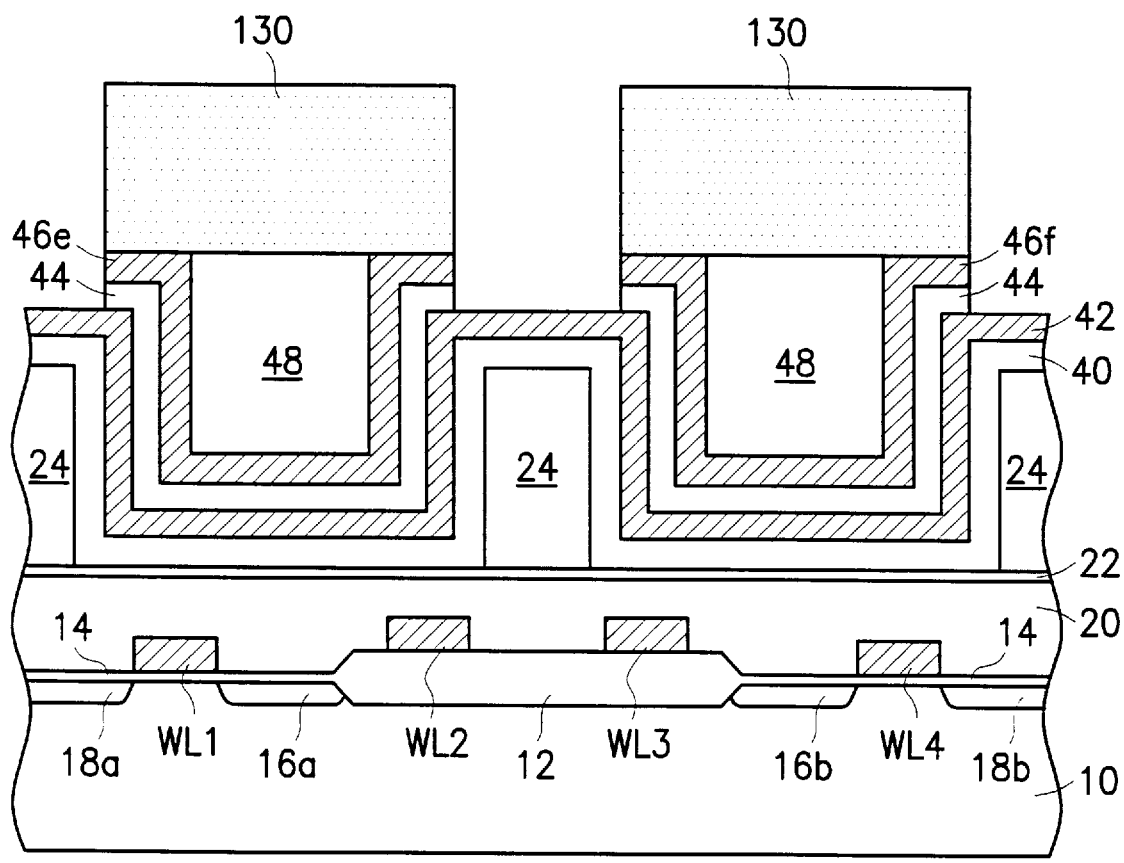
FIGS. 10A through 10D are cross-sectional views for explaining a ninth embodiment of a semiconductor memory cell having a tree-type capacitor according to the invention and a method for fabricating the same according to the invention.

Referring first to FIG. 10A together with FIG. 9A, after the fabrication has reached the stage shown in FIG. 9A, a conventional photolithographic process is used to form a photoresist layer 130 and anisotropic etching is performed on the exposed parts of the polysilicon layer 46 and the silicon dioxide layer 44. Through this process, the polysilicon layer 46 is divided into a number of separate sections designated by the numerals 46e, 46f.

Figure 10B:
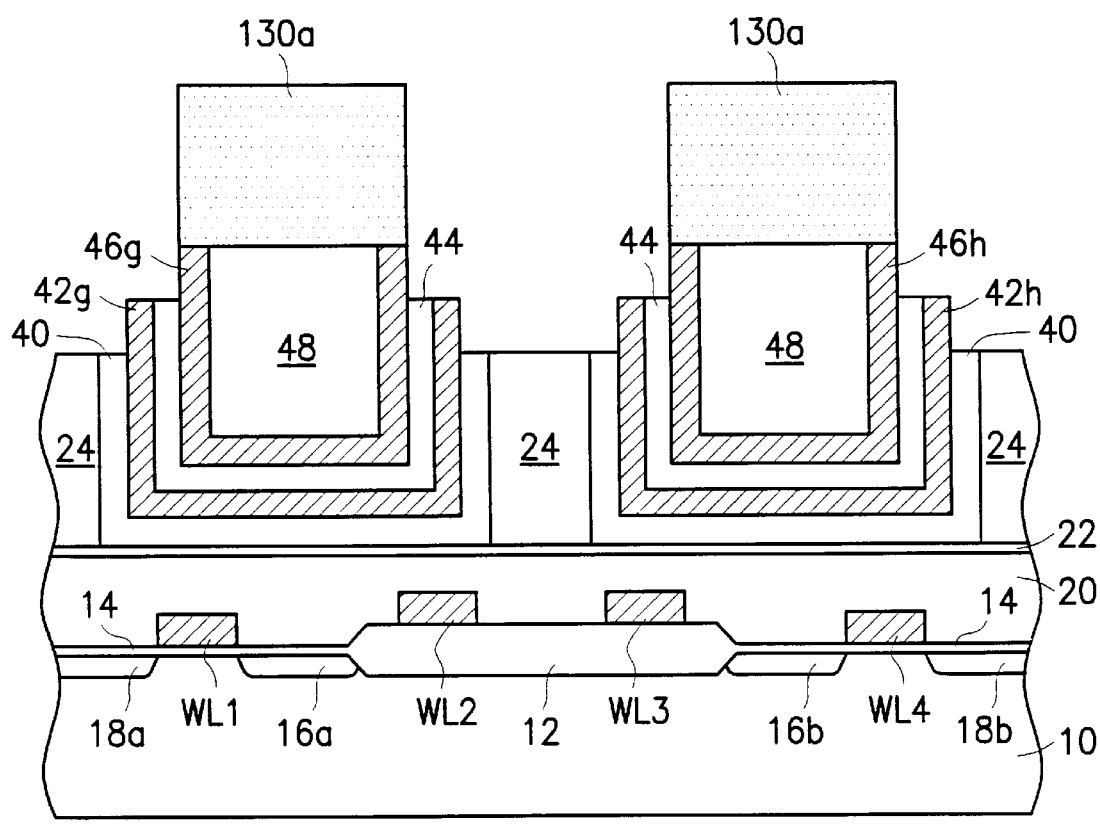

Referring next to FIG. 10B, in the subsequent step the photoresist erosion technique is used to erode away part of the photoresist layer 130, so as to form a photoresist layer 130a of reduced breadth and thickness. Part of the top surface of the polysilicon layers 46e, 46f is thus exposed. Then, anisotropic etching is performed on the exposed parts of the polysilicon layers 46e, 46f, and 42. Through this process, parts of the polysilicon layers 46e, 46f are further etched away, thereby forming polysilicon layers 46g, 46h of reduced size. After that, anisotropic etching is again performed on the exposed parts of the silicon dioxide layers 44, 40 until the topmost surfaces of the polysilicon layers 42g, 42h are exposed. The photoresist layer is then removed.

Figure 10C:
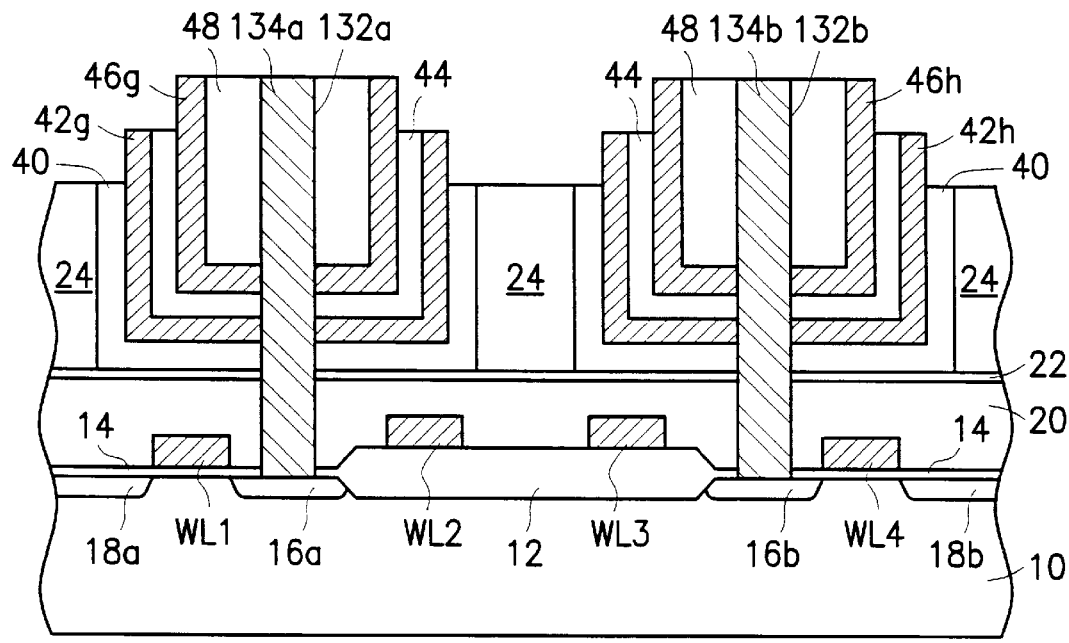

Referring next to FIG. 10C, in the subsequent step conventional photolithographic and etching processes are used to form storage electrode contact holes 132a, 132b which extend from the top surface of the insulating layer 48 to the top surfaces of the drain regions 16a and 16b. Then, the storage electrode contact holes 132a, 132b are refilled with polysilicon layers 134a, 134b, by first using the CVD method to deposit a polysilicon layer, and then etching back part of the polysilicon layer.

Figure 10D:
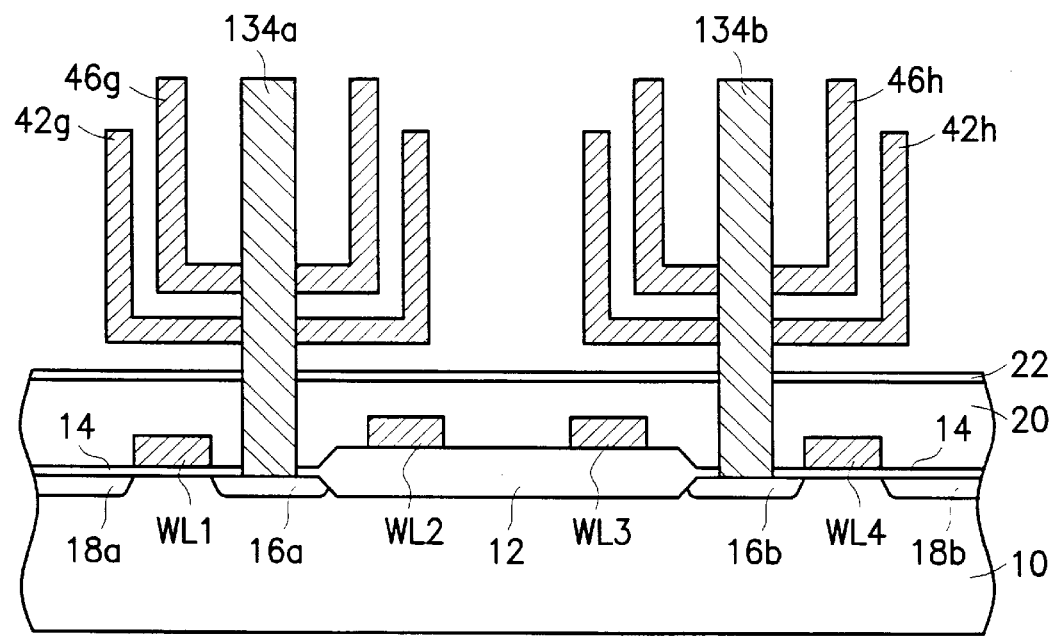

Referring finally to FIG. 10D, in the subsequent step, wet etching is performed on the wafer, with the etching protection layer 22 as the etch end point, so as to remove the insulating layers 40, 44, 48 of silicon dioxide and the insulating pillar 24. This completes the fabrication of the storage electrodes of the tree-type capacitors in the DRAM. A dielectric film and opposing polysilicon electrode may now be formed as described previously for the first, second and third embodiments. After that, the fabrication for the tree-type capacitors in the DRAM is complete.

The storage electrodes include trunk-like polysilicon layers 134a, 134b and branch-like polysilicon layers 42g, 46g and 42h, 46h having L-shaped cross sections. The trunk-like polysilicon layers 134a, 134b are electrically coupled respectively to the drain region 16a and the drain region 16b, of the transfer transistors in the DRAM. The branch-like polysilicon layers 42g, 46g and 42h, 46h have bottom-most, horizontal segments in respective contact with the trunk-like polysilicon layers 134a, 134b, and the substantially vertical segments of the branch-like polysilicon layers 46g, 46h are more elevated than that of the branch-like polysilicon layers 42g, 42h.

It will be apparent to those skilled in the art of semiconductor fabrication that the foregoing disclosed embodiments can be applied either alone or in combination so as to provide storage electrodes of various sizes and shapes on a single DRAM chip.

These variations are all within the scope of the invention.

Although in the accompanying drawings the embodiments of the drains of the transfer transistors are based on diffusion areas in a silicon substrate, other variations, for example trench type drain regions, are possible.

Elements in the accompanying drawings are schematic diagrams for demonstrative purpose and not depicted in the actual scale. The dimensions of the elements of the invention as shown should by no means be considered limitations on the scope of the invention.

While the invention has been described by way of example and in terms of preferred embodiments, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for fabricating a semiconductor memory device including a substrate, a transfer transistor having source/drain regions, formed in the substrate, and a charge storage capacitor electrically coupled to one of the source/drain regions, said method comprising the steps of:
   (1) forming a first insulating layer over the substrate, the first insulating layer covering the transfer transistor, and forming an etching protection layer over the first insulating layer;
   (2) forming an insulating pillar over the first insulating layer, the insulating pillar defining recess areas on either side thereon, including
      forming a thick insulating layer over the etching protection layer;
      forming a photoresist layer over the thick insulating layer, such that a first portion of the thick insulating layer is exposed;
      etching away part of the exposed first portion of the thick insulating layer to form the recess in the first exposed portion;
      eroding away a selected part of the photoresist layer so as to further expose a second portion of the thick insulating layer; and
      etching the exposed second portion and further etching the exposed first portion until the etching protection layer is exposed in the recess and so as to form the insulating pillar with a crooked cross section;
   (3) forming a first conductive layer over the insulating pillar, and over the first insulating layer in the recess areas;
   (4) removing parts of the first conductive layer leaving a plurality of first conductive layer sections;
   (5) forming a second conductive layer in a recess area, which penetrates at least through the first conductive layer and the first insulating layer, so as to be electrically coupled to one of the source/drain regions, the second conductive layer forming a base conductive layer, and the first conductive layer forming a branching conductive layer substantially L-shaped in cross section, the L-shaped cross section having one end connected to the base conductive layer, wherein the first conductive layer and the second conductive layer in combination form a storage electrode for the charge storage capacitor;
   (6) removing the insulating pillar;
   (7) forming a dielectric layer over the first and second conductive layers; and
   (8) forming a third conductive layer over the dielectric layer, the third conductive layer serving as an opposing electrode of the charge storage capacitor.

2. A method as claimed in claim 1, wherein said step (4) includes the step of etching away the selected part of the first conductive layer that lies above the insulating pillar.

3. A method as claimed in claim 1, wherein said step (4) includes the step of performing chemical mechanical polishing so as to polish away the selected part of the first conductive layer that lies above the insulating pillar.

4. A method as claimed in claim 1, further comprising, between said step (3) and said step (4) the step of forming a second insulating layer over the first conductive layer, such that the second insulating layer substantially fills up the recess area; and
   wherein said step (5) includes the step of forming the second conductive layer to penetrate through the second insulating layer; and
   wherein said step (6) includes the step of removing the second insulating layer.

5. A method as claimed in claim 1, further comprising, between said step (3) and said step (4), the steps of:
   forming alternately at least a first film of insulating material and a second film of conductive material, over the first conductive layer; and
   forming a second insulating layer over the second film, so as to substantially fill up the recess;
   wherein said step (4) further includes the step of removing a selected upper part of the second film that lies above the insulating pillar;
   wherein said step (5) further includes the step of forming the second conductive layer to penetrate successively through the second insulating layer, the second film, and the first film; and
   wherein said step (6) further includes the step of removing the second insulating layer and the first film.

6. A method as claimed in claim 1, wherein said step (5) further includes the step of forming the second conductive layer with a substantially U-shaped cross section.

7. A method as claimed in claim 1, wherein the recess area is bounded at a bottom thereof by the etching protection layer, the insulating pillar being formed on the etching protection layer.

8. A method as claimed in claim 1, further comprising, between said step (3) and said step (4) the step of forming a second insulating layer over the first conductive layer, the second insulating layer substantially filling up the recess area;
   wherein said step (5) includes forming the second conductive layer so as to penetrate through the second insulating layer; and
   wherein said step (6) includes removing the second insulating layer.

9. A method for fabricating a semiconductor memory device including a substrate, a transfer transistor having source/drain regions, formed on the substrate, and a charge storage capacitor electrically coupled to one of the source/drain regions, said method comprising the steps of:

(1) forming a first insulating layer over the substrate, the first insulating layer covering the transfer transistor;

(2) forming an insulating pillar over the first insulating layer, the insulating pillar defining recess areas on either side thereof;

(3) forming alternately a first film of insulating material and a second film of conductive material over the first insulating layer in a recess area and over the insulating pillar;

(4) removing a selected part of the second film that lies above the insulating pillar;

(5) forming a first conductive layer which penetrates at least through the second film, the first film, and the first insulating layer so as to be electrically coupled to one of the source/drain regions, wherein the first conductive layer and the second film in combination form a storage electrode of the charge storage capacitor;

(6) removing the insulating pillar and the first film;

(7) forming a dielectric layer over exposed surfaces of the first conductive layer and the second film; and (8) forming a second conductive layer over the dielectric layer, the second conductive layer serving as an opposing electrode of the charge storage capacitor;

wherein the first conductive layer forms a base conductive layer and the second film forms a branching conductive layer substantially L-shaped in cross section, the branching conductive layer having one end connected to the base conductive layer.

10. A method as claimed in claim 9, wherein said step (4) includes the step of etching away the selected part of the second film that lies above the insulating pillar.

11. A method as claimed in claim 9, wherein said step (4) includes the step of using chemical mechanical polishing to polish away the selected part of the second film that lies above the insulating pillar.

12. A method as claimed in claim 9, further comprising, between said step (3) and said step (4), the step of forming a second insulating layer over the second film, such that the second insulating layer substantially fills up the recess area;

wherein said step (5) includes the step of forming the first conductive layer so as to penetrate through the second insulating layer; and said step (6) includes the step of removing the second insulating layer.

13. A method as claimed in claim 9, further comprising, between said steps (1) and (2), a step of forming an etching protection layer over the first insulating layer; and wherein said step (2) further includes the steps of:
forming a thick insulating layer over the etching protection layer;
forming a photoresist layer over the thick insulating layer, such that the recess area is exposed;
removing an exposed part of the thick insulating layer in the recess area;
eroding away part of the photoresist layer so as to expose a further part of the thick insulating layer;
removing the further exposed part of the thick insulating layer to expose the etching protection layer, so as to form the insulating pillar with a crooked cross section; and
removing the photoresist layer.

14. A method as claimed in claim 13, wherein said step (4) includes the step of etching away the selected part of the second film that lies above the insulating pillar.

15. A method as claimed in claim 13, wherein said step (4) includes the step of using chemical mechanical polishing to polish away the selected part of the second film that lies above the insulating pillar.

16. A method as claimed in claim 13, further comprising, between said step (3) and said step (4), the step of forming a second insulating layer over the second film such that the second insulating layer substantially fills up the recess area;

wherein said step (5) includes the step of forming the first conductive layer so as to penetrate through the second insulating layer; and wherein said step (6) includes the step of removing the second insulating layer.

17. A method as claimed in claim 13, wherein said step (5) further includes the step of forming the first conductive layer with a substantially U-shaped cross section.

* * * * *